United States Patent
Park et al.

(10) Patent No.: US 11,764,231 B2
(45) Date of Patent: Sep. 19, 2023

(54) DISPLAY DEVICE AND METHOD FOR MANUFACTURING THE SAME

(71) Applicants: Samsung Display Co., Ltd., Yongin-si (KR); Industry-University Cooperation Foundation Hanyang University ERICA Campus, Ansan-si (KR)

(72) Inventors: Joon Seok Park, Yongin-si (KR); Sae Roon Ter Oh, Seoul (KR); Jun Hyung Lim, Seoul (KR); Su Hyun Kim, Seongnam-si (KR); Young Joon Choi, Busan (KR)

(73) Assignees: Samsung Display Co., Ltd., Yongin-si (KR); Industry-University Cooperation Foundation Hanyang University ERICA Campus, Ansan-si (KR)

( * ) Notice: Subject to any disclaimer, the term of this patent is extended or adjusted under 35 U.S.C. 154(b) by 119 days.

(21) Appl. No.: 17/367,198

(22) Filed: Jul. 2, 2021

(65) Prior Publication Data

US 2022/0013549 A1    Jan. 13, 2022

(30) Foreign Application Priority Data

Jul. 9, 2020    (KR) .......................... 10-2020-0084618

(51) Int. Cl.
*H01L 27/00*     (2006.01)
*H01L 27/12*     (2006.01)

(52) U.S. Cl.
CPC ........ *H01L 27/1262* (2013.01); *H01L 27/124* (2013.01); *H01L 27/1225* (2013.01)

(58) Field of Classification Search
CPC ............... H01L 27/1225; H01L 27/124; H01L 27/3272; H01L 27/324
See application file for complete search history.

(56) References Cited

U.S. PATENT DOCUMENTS 9,147,719 B2 * 9/2015 Kim ..................... H01L 27/1251
2015/0123084 A1 * 5/2015 Kim ..................... H01L 27/3276
257/43

(Continued)

FOREIGN PATENT DOCUMENTS

EP         3621112 A1     3/2020
KR    10-2015-0051824 A   5/2015

(Continued)

OTHER PUBLICATIONS

Chen, Rongsheng et al.; "Self-aligned top-gate InGaZnO thin film transistors using $SiO_2/Al_2O_3$ stack gate dielectric"; Thin Solid Films; 548; 2013; pp. 572-575.

*Primary Examiner* — Nikolay K Yushin
(74) *Attorney, Agent, or Firm* — Lewis Roca Rothgerber Christie LLP

(57) ABSTRACT

A display device includes: a substrate; a light blocking layer of a driving transistor and an active layer of a switching transistor on the substrate; a buffer layer on the light blocking layer, the buffer layer overlapping the light blocking layer; an active layer of the driving transistor on the buffer layer; a first gate insulating layer on the active layer of the driving transistor and the active layer of the switching transistor; and a first gate electrode on the first gate insulating layer and overlapping the active layer of the driving transistor and a second gate electrode overlapping the active layer of the switching transistor, wherein the light blocking layer and the active layer of the switching transistor are on a same layer.

22 Claims, 16 Drawing Sheets

(56) References Cited

U.S. PATENT DOCUMENTS

| | | | |
|---|---|---|---|
| 2018/0061857 A1 | 3/2018 | Kanda et al. | |
| 2018/0061921 A1 | 3/2018 | Son et al. | |
| 2019/0140101 A1 | 5/2019 | Im et al. | |
| 2019/0386144 A1 | 12/2019 | Ding et al. | |

FOREIGN PATENT DOCUMENTS

| | | |
|---|---|---|
| KR | 10-2016-0093749 A | 8/2016 |
| KR | 10-2017-0050850 A | 5/2017 |
| KR | 10-2067669 B1 | 1/2020 |
| KR | 10-2087029 B1 | 3/2020 |

\* cited by examiner

FIG. 5

| Buffer | Material | [H] (/cm$^3$) |
|---|---|---|
| Buffer 2 | SiO$_x$ | $2.74 \times 10^{20}$ |
| Buffer 1 | SiN$_x$ | $1.73 \times 10^{22}$ |

FIG. 6

| Other candidates | Material | [H] (/cm$^3$) |
|---|---|---|
| Buffer 2 | SiO$_x$ | $5.19 \times 10^{20}$ |
| Buffer 1 | SiON$_x$ | $1.32 \times 10^{21}$ |
| | | $1.96 \times 10^{22}$ |

DISPLAY DEVICE AND METHOD FOR MANUFACTURING THE SAME

CROSS-REFERENCE TO RELATED APPLICATION

The present application claims priority to and the benefit of Korean Patent Application No. 10-2020-0084618 filed on Jul. 9, 2020 in the Korean Intellectual Property Office, the entire content of which is incorporated herein by reference.

BACKGROUND

1. Field

Aspects of some embodiments of the present disclosure relate to a display device and a method for manufacturing the same.

2. Description of the Related Art

With the advance of information-oriented society, more and more demands are placed on display devices for displaying images in various ways. Accordingly, display devices that have been researched in recent years include a liquid crystal display (LCD) device, a plasma display panel (PDP) device, an organic light emitting display (OLED) device, and a micro light emitting diode (micro LED) display device.

An OLED device and the micro LED display device may include a light emitting diode, a first transistor for adjusting the amount of a driving current supplied from a power supply line to the light emitting diode depending on a voltage of a gate electrode, and a scan transistor for applying a data voltage of a data line to the gate electrode of the first transistor in response to a scan signal of a scan line.

A driving voltage of the first transistor indicates the voltage applied to the gate electrode of the first transistor to flow the driving current. A driving voltage range of the first transistor indicates a voltage range of a first voltage, which may allow a predetermined minimum driving current to flow, to a second voltage which may allow a predetermined maximum driving current to flow.

The above information disclosed in this Background section is only for enhancement of understanding of the background and therefore the information discussed in this Background section does not necessarily constitute prior art.

SUMMARY

Aspects of some embodiments of the present disclosure may include a display device in which element characteristics of a driving transistor and a switching transistor of each of pixels are relatively improved.

Aspects of some embodiments of the present disclosure may also include a method for manufacturing a display device in which element characteristics of a driving transistor and a switching transistor of each of pixels are relatively improved.

However, aspects of embodiments according to the present disclosure are not restricted to those set forth herein. The above and other aspects of embodiments according to the present disclosure will become more apparent to one of ordinary skill in the art to which the present disclosure pertains by referencing the detailed description of the present disclosure given below.

According to some embodiments, a display device includes: a substrate; a light blocking layer of a driving transistor and an active layer of a switching transistor on the substrate; a buffer layer on the light blocking layer, the buffer layer overlapping the light blocking layer; an active layer of the driving transistor on the buffer layer; a first gate insulating layer on the active layer of the driving transistor and the active layer of the switching transistor; and a first gate electrode on the first gate insulating layer and overlapping the active layer of the driving transistor and a second gate electrode overlapping the active layer of the switching transistor, wherein the light blocking layer and the active layer of the switching transistor are on the same layer.

According to some embodiments, in a method for manufacturing a display device, the method includes: sequentially stacking an active layer and a first buffer layer on a substrate on which a first transistor region and a second transistor region separated from the first transistor region are defined; forming a light blocking layer and an active layer of the second transistor by etching the active layer and the first buffer layer, which have been sequentially stacked, in accordance with the respective transistor regions; and forming a second buffer layer on the first buffer layer, wherein the first buffer layer has a hydrogen concentration higher than that of the second buffer layer.

In accordance with the display device and the method for manufacturing the same according to some embodiments, it may be possible to improve the element characteristics of the driving transistor and the switching transistor of each of pixels.

The characteristics of embodiments according to the present disclosure are not limited to the aforementioned characteristics, and various other characteristics are included in the present specification.

BRIEF DESCRIPTION OF THE DRAWINGS

The above and other aspects and features of the present disclosure will become more apparent by describing in more detail aspects of some embodiments thereof with reference to the attached drawings, in which:

FIGS. 5 and 6 are tables representing materials and hydrogen concentrations of first and second buffer layers;

DETAILED DESCRIPTION

Figure 1:
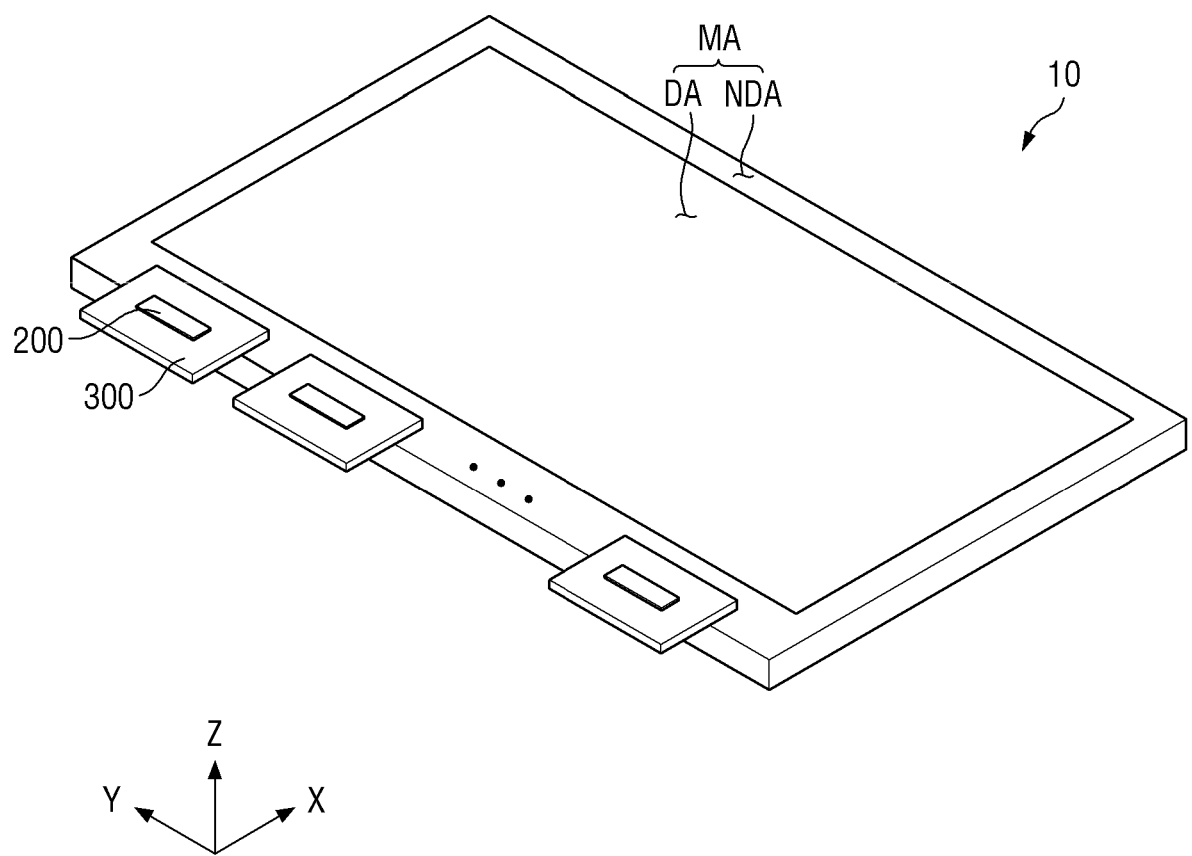
FIG. 1 is a perspective view of a display device according to some embodiments.

Specific structural and functional descriptions of embodiments of the invention disclosed herein are only for illustrative purposes of the embodiments of the invention. The invention may be embodied in many different forms without departing from the spirit and scope of embodiments according to the invention. Therefore, the embodiments of the invention are disclosed only for illustrative purposes and should not be construed as limiting the invention. That is, the invention is only defined by the scope of the claims and their equivalents.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Aspects of some embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims and their equivalents.

Hereinafter, aspects of some embodiments of the invention will be described with reference to the attached drawings.

Figure 2:
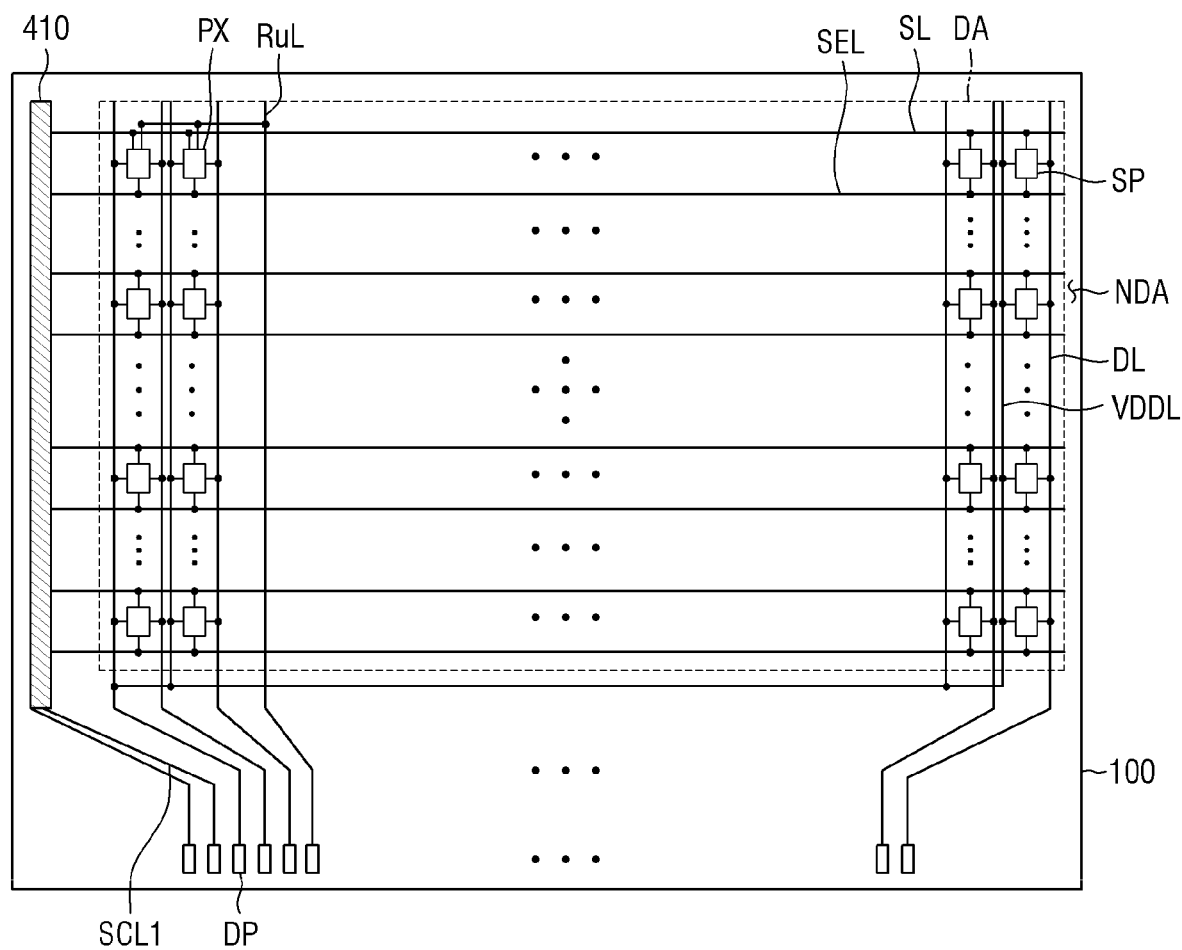
FIG. 2 is a plan view illustrating an example of a display panel according to some embodiments.

FIG. 1 is a perspective view of a display device according to some embodiments. FIG. 2 is a plan view illustrating an example of a display panel according to some embodiments.

The terms "above," "top" and "upper surface" used herein refer to an upward direction (i.e., a Z-axis direction) with respect to a display panel 100. The terms "below," "bottom" and "lower surface" used herein refer to a downward direction (i.e., a direction opposite to the Z-axis direction) with respect to the display panel 100. Further, "left", "right", "upper" and "lower" indicate directions when the display panel 100 is viewed from above. For example, the term "left" indicates a direction opposite to an X-axis direction, the term "right" indicates the X-axis direction, the term "upper" indicates a Y-axis direction, and the term "lower" indicates a direction opposite to the Y-axis direction.

A display device 10 is a device for displaying moving images (e.g., video images) or still or static images. The display device 10 may be used as a display screen of various products such as televisions, laptop computers, monitors, billboards and the Internet of Things (IOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs). The display device 10 may be any one of an organic light emitting display device, a liquid crystal display device, a plasma display device, a field emission display device, an electrophoretic display device, an electrowetting display device, a quantum dot light emitting display device, a micro LED display device, and the like. In the following description, it is assumed that the display device 10 is an organic light emitting display device, but embodiments according to the present disclosure are not limited thereto.

Referring to FIGS. 1 and 2, the display device 10 according to some embodiments includes a display panel 100, a display driver 200, and a circuit board 300.

The display panel 100 may be formed in a rectangular shape, in a plan view (e.g., a view from a direction perpendicular or normal with respect to a display surface of the display panel 100), having short sides in a first direction (X-axis direction) and long sides in a second direction (Y-axis direction) crossing the first direction (X-axis direction). The corner where the short side in the first direction (X-axis direction) and the long side in the second direction (Y-axis direction) meet may be right-angled. In some embodiments, the corner where the short side in the first direction (X-axis direction) and the long side in the second direction (Y-axis direction) meet may be rounded to have a curvature (e.g., a set or predetermined curvature).

The planar shape of the display panel 100 is not limited to the rectangular shape, and according to some embodiments, the display panel 100 may be formed in any suitable shape, for example, another polygonal shape, a circular shape or an elliptical shape. The display panel 100 may be formed to be flat. However, without being limited thereto, the display panel 100 may include a curved portion formed at left and right ends and having a curvature (e.g., a set or predetermined curvature) or a varying curvature. In addition, the display panel 100 may be formed flexibly such that it can be twisted, bent, folded, or rolled.

The display panel 100 may include a display area DA where sub-pixels PX are formed to display an image and a non-display area NDA which is a peripheral area of the display area DA. When the display panel 100 includes a curved portion, the display area DA may be located on the curved portion. In this case, the image of the display panel 100 may also be seen on the curved portion.

In addition to the sub-pixels PX, scan lines SL connected to the sub-pixels PX, sensing signal lines SEK, data lines DL, reference voltage lines RuL, and first driving voltage lines VDDL may be arranged in the display area DA. The scan lines SL and the sensing signal lines SEK may be formed in parallel in the second direction (Y-axis direction). The data lines DL and the reference voltage lines RuL may be formed in parallel in the first direction (X-axis direction) crossing the second direction (Y-axis direction). The first driving voltage lines VDDL may be formed in parallel along the first direction (X-axis direction) in the display area DA. The first driving voltage lines VDDL formed in parallel along the first direction (X-axis direction) in the display area DA may be connected to each other in the non-display area NDA.

Each of the sub-pixels PX may be connected to at least one of the scan lines SL, one of the data lines DL, at least one of the sensing signal lines SEK, one of the reference voltage lines RuL, and/or one of the first driving voltage lines VDDL. For simplicity of description, FIG. 2 illustrates that each of the sub-pixels PX is connected to one scan line SL, one data line DL, one sensing signal line SEK, one reference voltage line RuL, and the first driving voltage line VDDL, but embodiments according to the present disclosure are not limited thereto. For example, each of the sub-pixels PX may be connected to three scan lines SL rather than two scan lines SL. Each of the sub-pixels PX may include a driving transistor DT, at least one switching transistor, a light emitting element, and a capacitor. The driving transistor DT may emit light by supplying a driving current to the light emitting element according to the data voltage applied to the gate electrode. The driving transistor and the at least one switching transistor may be thin film transistors. The light emitting element may emit light according to the driving current of the driving transistor. The light emitting element may be an organic light emitting diode including a first electrode, an organic light emitting layer and a second electrode. The capacitor may serve to keep constant the data voltage applied to the gate electrode of the driving transistor DT.

The non-display area NDA may be defined as an area from the boundary of the display area DA to the edge of the display panel 100. A scan driver 410 for applying scan signals to the scan lines SL and pads DP connected to the data lines DL may be located in the non-display area NDA. Because the circuit board 300 is attached to the pads DP, the pads DP may be located at one edge of the display panel 100, e.g., at the lower edge of the display panel 100.

The scan driver 410 may be connected to the display driver 200 through a plurality of first scan control lines SCL1. The scan driver 410 may receive a scan control signal from the pads DP through the plurality of first scan control lines SCL1. The scan driver 410 may generate scan signals in response to the scan control signal, and output the scan signals sequentially to the scan lines SL. The sub-pixels PX, to which data voltages are to be supplied, are selected by the scan signals from the scan driver 410, and the data voltages are supplied to the selected sub-pixels PX.

FIG. 2 illustrates that the scan driver 410 is located outside the one side of the display area DA, but embodiments according to the present disclosure are not limited thereto.

The display driver 200 receives digital video data and timing signals from the outside. The display driver 200 converts the digital video data into analog positive/negative data voltages and supplies them to the data lines DL. The display driver 200 generates and supplies the scan control signal for controlling an operation timing of the scan driver 410 through the first scan control lines SCL1. In addition, the display driver 200 may supply a first driving voltage to the first driving voltage line VDDL.

The display driver 200 may be formed of an integrated circuit (IC) and attached onto the circuit board 300 by a chip on film (COF) method. Alternatively, the display driver 200 may be directly attached onto the display panel 100 by a chip on glass (COG) method, a chip on plastic (COP) method, or an ultrasonic bonding method.

The circuit board 300 may be attached onto the pads DP using an anisotropic conductive film. Accordingly, lead wires of the circuit board 300 may be electrically connected to the pads DP. The circuit board 300 may be a flexible printed circuit board, a printed circuit board, or a flexible film such as a chip on film.

Figure 3:
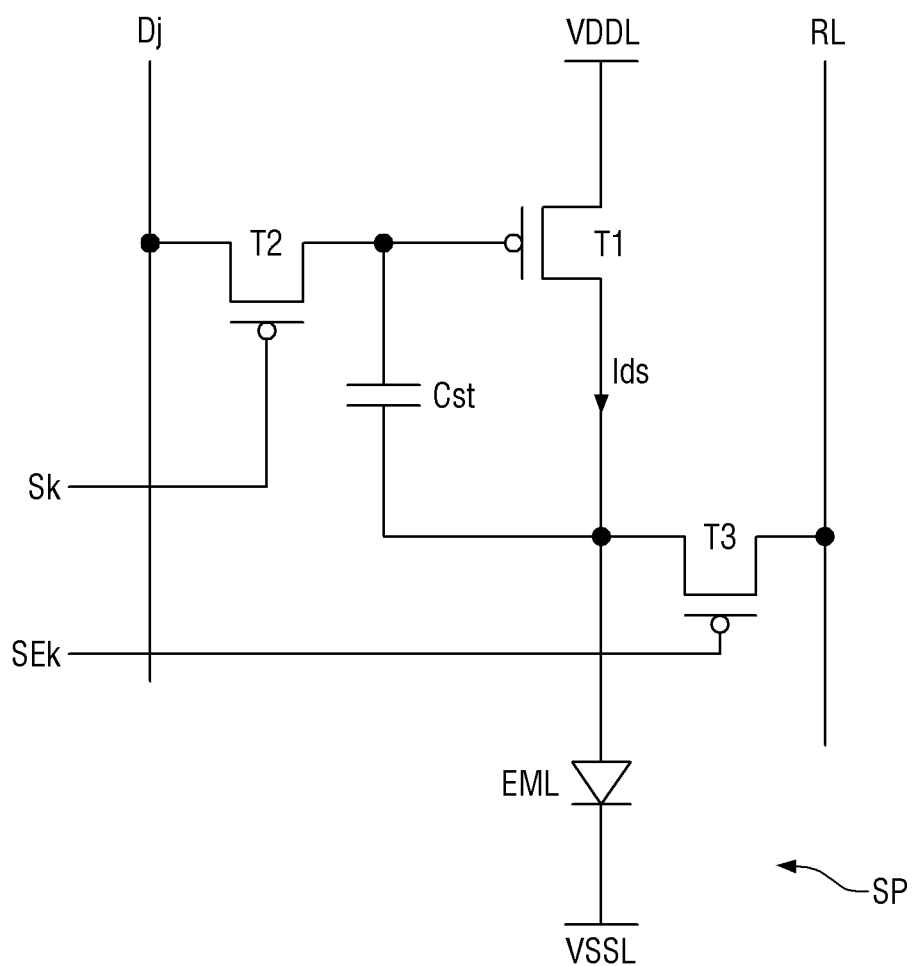
FIG. 3 is a circuit diagram illustrating an example of the sub-pixel of FIG. 2.

FIG. 3 is a circuit diagram illustrating an example of the sub-pixel of FIG. 2.

FIG. 3 illustrates the sub-pixel PX connected to a $k^{th}$ scan line Sk, a $k^{th}$ sensing signal line SEk, a reference voltage line RL, and a $j^{th}$ data line Dj.

Referring to FIG. 3, the sub-pixel PX may overlap the $k^{th}$ scan line Sk, the $k^{th}$ sensing signal line SEk, the reference voltage line RL, and the $j^{th}$ data line Dj. In addition, the sub-pixel PX may be connected to the first driving voltage line VDDL to which the first driving voltage is applied, an initialization voltage line VIL to which an initialization voltage is applied, and a second driving voltage line VSSL to which a second driving voltage lower than the first driving voltage is applied.

The sub-pixel PX includes a driving transistor DT, a light emitting element EML, switch elements, and a first capacitor Cst. For example, the sub-pixel PX may include a first transistor T1 as the driving transistor DT, and second and third transistors T2 and T3 as the switch elements. However, the sub-pixel PX of embodiments according to the present disclosure is not limited to that shown in FIG. 3.

The first transistor T1 may include a first gate electrode, a first source electrode, and a first drain electrode. The first transistor T1 controls a drain-source current Ids (hereinafter, referred to as "driving current") based on a data voltage applied to the first gate electrode. The driving current Ids flowing through a channel of the first transistor T1 is proportional to the square of the difference between a threshold voltage and a voltage Vgs between the first gate electrode and the first source electrode of the first transistor T1, as shown in Eq. 1.

$$Ids = k' \times (Vgs - Vth)^2 \qquad \text{Eq. 1}$$

In Eq. 1, k' is a proportional coefficient determined by the structure and physical characteristics of the first transistor T1, Vgs is a gate-source voltage of the first transistor T1, and Vth is a threshold voltage of the first transistor T1.

The light emitting element EML emits light by the driving current Ids. A light emission amount of the light emitting element EML may be proportional to the driving current Ids. The light emitting element EML may be an organic light emitting diode including a first electrode, a second electrode, and an organic light emitting layer located between the first electrode and the second electrode. Alternatively, the light emitting element EML may be an inorganic light emitting element including a first electrode, a second electrode, and an inorganic semiconductor located between the first electrode and the second electrode. Alternatively, the light emitting element EML may be a quantum dot light emitting element including a first electrode, a second electrode, and a quantum dot light emitting layer located between the first electrode and the second electrode. Alternatively, the light emitting element EML may be a micro light emitting diode.

The first electrode of the light emitting element EML may be connected to the second electrode of the first transistor T1, and the second electrode thereof may be connected to the second driving voltage line VSSL. A parasitic capacitance may be formed between the anode electrode and the cathode electrode of the light emitting element EML.

The second transistor T2 is turned on by a scan signal of the $k^{th}$ scan line Sk to connect the first gate electrode of the first transistor T1 to the $j^{th}$ data line Dj. The second transistor T2 may include a second gate electrode, a second source electrode, and a second drain electrode. The second gate electrode may be connected to the $k^{th}$ scan line Sk, the second source electrode may be connected to the first gate electrode of the first transistor T1, and the second drain electrode may be connected to the $j^{th}$ data line Dj.

The third transistor T3 is turned on by a $k^{th}$ sensing signal of the $k^{th}$ sensing signal line SEk to connect the reference voltage line RL to the first source electrode of the first transistor T1. The third transistor T3 may include a third gate electrode, a third source electrode, and a third drain electrode. The third gate electrode of the third transistor T3 may be connected to the $k^{th}$ sensing signal line SEk, the third source electrode thereof may be connected to the reference voltage line RL, and the third drain electrode thereof may be connected to the source electrode of the first transistor T1.

The third transistor T3 may include a third gate electrode, a third source electrode, and a third drain electrode. The third gate electrode may be connected to the $k^{th}$ sensing signal line SEk, the third source electrode may be connected to the first gate electrode of the first transistor T1, and the third drain electrode may be connected to the reference voltage line RL.

The first capacitor Cst may be formed between the first gate electrode of the first transistor T1 and the first electrode of the light emitting element EML. One electrode of the first capacitor Cst may be connected to the first gate electrode of the first transistor T1, and the other electrode thereof may be connected to the first electrode of the light emitting element EML.

The active layer of each of the first to third transistors T1, T2, and T3 may be formed of an oxide semiconductor including at least one metal of indium (In), gallium (Ga), zinc (Zn), or tin (Sn), and oxygen (O).

Further, in FIG. 3, each of the first to third transistors T1, T2, and T3 is mainly described as being formed of an n-type MOSFET (metal oxide semiconductor field effect transistor), but embodiments according to the present disclosure are not limited thereto, and the first to third transistors T1-T3 may be formed of a p-type MOSFET.

Figure 4:
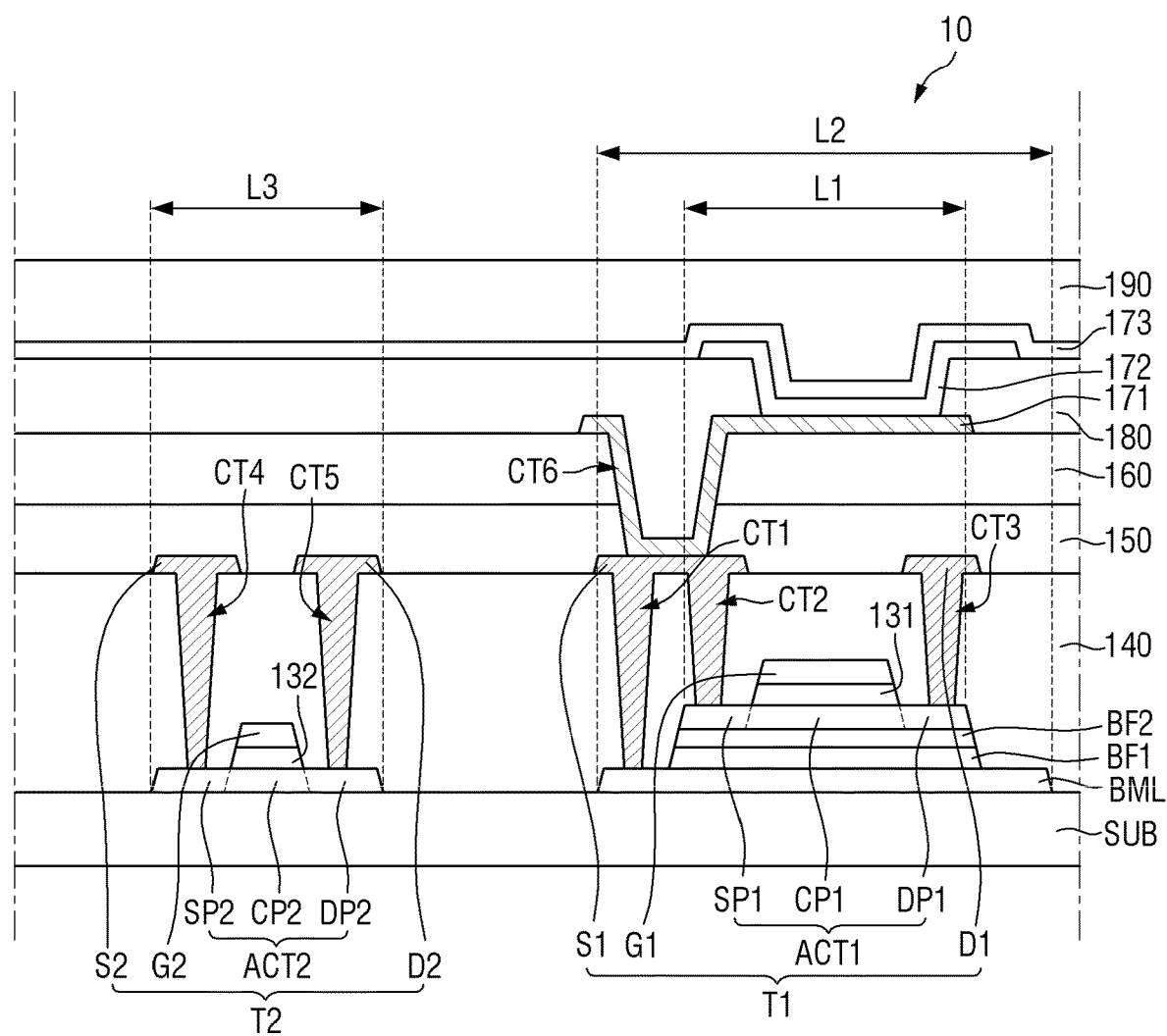
FIG. 4 is a cross-sectional view illustrating an example of the first transistor and the second transistor of FIG. 3.

FIG. 4 is a cross-sectional view illustrating an example of the first transistor and the second transistor of FIG. 3.

Referring to FIG. 4, a substrate SUB may be a rigid substrate or a flexible substrate which can be bent, folded or rolled. The substrate SUB may be formed of an insulating material such as glass, quartz, or a polymer resin.

The first transistor T1 and the second transistor T2 may be formed on the substrate SUB. The first transistor T1 may include a first active electrode (layer) ACT1, a first gate electrode G1, a first source electrode S1, and a first drain electrode D1. The second transistor T2 may include a second active electrode (layer) ACT2, a second gate electrode G2, a second source electrode S2, and a second drain electrode D2.

Meanwhile, the display device 10 according to some embodiments may further include a light blocking layer BML arranged to overlap the first transistor T1.

The light blocking layer BML may be arranged to overlap the first active layer ACT1. The light blocking layer BML may prevent or reduce instances of light, which is incident from the substrate SUB, entering a first channel region CP1 of the first active layer ACT1. Therefore, it may be possible to prevent or reduce instances of a leakage current due to light flowing in the first channel region CP1 of the first active layer ACT1.

The light blocking layer BML may be arranged to overlap the first transistor T1 as a driving transistor without overlapping the second transistor T2 as a switching transistor. In the case of the switching transistor, it may be desirable to minimize a parasitic capacitance in the display panel 100 in order to ensure a fast charging rate. On the other hand, in the case of the driving transistor, it may be desirable to increase a driving range. Therefore, the light blocking layer BML may be designed to overlap the first transistor T1 without overlapping the second transistor T2.

The light blocking layer BML, and the second active layer ACT2 of the second transistor T2 may be located on the same layer. The light blocking layer BML, and the second active layer ACT2 of the second transistor T2 may include the same material, and may be formed through the same process.

The first active layer ACT1 may include the first channel region CP1, a first source region SP1 on one side of the first channel region CP1, and a first drain region DP1 on the other side of the first channel region CP1. The second active layer ACT2 may include a second channel region CP2, a second source region SP2 on one side of the second channel region CP2, and a second drain region DP2 on the other side of the second channel region CP2.

The second active layer ACT2 and the light blocking layer BML may be formed of an oxide semiconductor including indium (In), gallium (Ga), and oxygen (O). For example, each of the second active layer ACT2 and the light blocking layer BML may be made of IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn), and oxygen (O)).

Buffer layers BF1 and BF2 may be located on the light blocking layer BML. The buffer layers BF1 and BF2 may include a first buffer layer BF1 and a second buffer layer BF2 located on the first buffer layer BF1. The side surfaces of the first buffer layer BF1 and the second buffer layer BF2 on the first buffer layer BF1 may be aligned in a thickness direction. The buffer layers BF1 and BF2 may be positioned on the central portion of the light blocking layer BML and may expose the side portions of the light blocking layer BML. For example, the buffer layers BF1 and BF2 may be located on the central portion (portion where the first active layer ACT1 is located) of the light blocking layer BML, and may expose one side portion and the other side portion of the light blocking layer BML, respectively, with respect to the central portion thereof. In other words, the side surfaces of the buffer layers BF1 and BF2 may be respectively arranged more inward than the side surfaces of the light blocking layer BML.

The first buffer layer BF1 may be located directly on the upper surface of the light blocking layer BML, and the second buffer layer BF2 may be located directly on the upper surface of the first buffer layer BF1 and directly on the lower surface of the first active layer ACT1.

The first buffer layer BF1 and the second buffer layer BF2 may have different hydrogen concentrations. According to some embodiments, the first buffer layer BF1 may have the hydrogen concentration higher than the hydrogen concentration of the second buffer layer BF2. Because the hydrogen concentration of the first buffer layer BF1 is higher than the hydrogen concentration of the second buffer layer BF2, more hydrogen may be introduced into the light blocking layer BML. Subsequently, the light blocking layer BML may be made conductive (e.g., n+), similarly to the second active layer ACT2, as will be described later.

Further, because the hydrogen concentration of the second buffer layer BF2 is lower than the hydrogen concentration of the first buffer layer BF1, it may be possible to prevent or reduce instances of a large amount of hydrogen entering the first active layer ACT1, thereby preventing or reducing instances of a short circuit (short circuit between the first source region SP1 and the first drain region DP1) of the first active layer ACT1. In other words, because the hydrogen concentration of the second buffer layer BF2 is lower than the hydrogen concentration of the first buffer layer BF1, it may be possible to prevent or reduce instances of a large amount of hydrogen entering the first active layer ACT1, thereby increasing the length of the first channel region CP1 of the active layer ACT1. The first active layer ACT1, the light blocking layer BML and the second active layer ACT2 may have a first length L1, a second length L2, and a third length L3, respectively.

The first length L1 is defined as a length from one side surface (side surface opposite to the side surface in contact with the first channel region CP1) of the first source region SP1 of the first active layer ACT1 or one end portion of the first active layer ACT1 to one side surface (side surface opposite to the side surface in contact with the first channel region CP1) of the first drain region DP1 of the first active layer ACT1 or the other end portion of the first active layer ACT1. The second length L2 is defined as a length from one side surface (or one end portion) of the light blocking layer BML, which faces the adjacent second active layer ACT2, to the other side surface (or the other end portion) of the light blocking layer BML, which is a surface opposite to the one side surface (or the one end portion) thereof. Further, the third length L3 is defined as a length from one side surface (side surface opposite to the side surface in contact with the second channel region CP2) of the second source region SP2 of the second active layer ACT2 or one end portion of the second active layer ACT2 to one side surface (side surface opposite to the side surface in contact with the second channel region CP2) of the second drain region DP2 of the second active layer ACT2 or the other end portion of the second active layer ACT2. According to some embodiments, the first length L1 may be smaller than the second length L2 and greater than the third length L3. Because the second length L2 is greater than the first length L1, the first active layer ACT1 may be protected from below.

The different hydrogen concentrations of the first buffer layer BF1 and the second buffer layer BF2 may be due to the difference in materials of the first and second buffer layers BF1 and BF2.

According to some embodiments, the first buffer layer BF1 may include silicon nitride or silicon oxynitride, and the second buffer layer BF2 may include silicon oxide.

For example, the second buffer layer BF2 may have a hydrogen concentration of about $1 \times 10^{21}$ atoms/cm$^3$ or less, and the first buffer layer BF1 may have a hydrogen concentration of about 2 to 100 times or more than the hydrogen concentration of the second buffer layer BF2. For example, the first buffer layer BF1 may have a hydrogen concentration greater than about $1 \times 10^{21}$ atoms/cm$^3$.

Specific hydrogen concentrations of the first and second buffer layers BF1 and BF2 are illustrated in FIGS. 5 and 6.

FIGS. 5 and 6 are tables representing materials and hydrogen concentrations of first and second buffer layers. FIG. 5 illustrates aspects of embodiments in which silicon nitride is utilized as a material of the first buffer layer BF1, and silicon oxide as a material of the second buffer layer BF2. FIG. 6 illustrates aspects of embodiments in which silicon oxynitride is utilized as a material of the first buffer layer BF1, and silicon oxide as a material of the second buffer layer BF2.

Referring to FIG. 4 again, gate insulating layers 131 and 132 may be formed on the first and second active layers ACT1 and ACT2. The gate insulating layers 131 and 132 may include a first gate insulating layer 131 located on a partial area of the first active layer ACT1 and a second gate insulating layer 132 located on a partial area of the second active layer ACT2. The first and second gate insulating layers 131 and 132 may be located on the same layer, may be made of the same material, and may be formed through the same process. The gate insulating layers 131 and 132 may be formed of an inorganic layer, for example, silicon oxide.

The gate insulating layers 131 and 132 may be arranged to overlap the channel regions CP1 and CP2 of the active layers ACT1 and ACT2, respectively.

The gate insulating layers 131 and 132 may have hydrogen concentrations lower than the hydrogen concentration of the first buffer layer BF1. For example, the gate insulating layers 131 and 132 may include silicon oxide. For another example, the gate insulating layers 131 and 132 may include silicon oxynitride.

Gate electrodes G1 and G2 may be located on the gate insulating layers 131 and 132. The gate electrodes G1 and G2 may include the first gate electrode G1 located on the first gate insulating layer 131 and the second gate electrode G2 located on the second gate insulating layer 132. The first gate electrode G1 may be arranged to overlap the first channel region CP1 of the first active layer ACT1, and the second gate electrode G2 may be arranged to overlap the second channel region CP2 of the second active layer ACT2. The side surfaces of the gate electrodes G1 and G2 may be respectively aligned with the side surfaces of the gate insulating layers 131 and 132 in the thickness direction.

The gate electrodes G1 and G2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

An interlayer insulating layer 140 may be located on the gate electrodes G1 and G2. The interlayer insulating layer 140 may be formed of an inorganic layer such as silicon oxide, silicon nitride, silicon oxynitride, titanium oxide, or aluminum oxide.

The interlayer insulating layer 140 may have a hydrogen concentration higher than the hydrogen concentration of the second buffer layer BF2 according to some embodiments. The interlayer insulating layer 140 may be deposited in a method for manufacturing a display device, which will be described later, and then serve to supply hydrogen to the source and drain regions SP1 and DP1, and the source and drain regions SP2 and DP2 of the respective active layers ACT1 and ACT2 through a heat treatment process. After the interlayer insulating layer 140 is deposited, if hydrogen is supplied to the source and drain regions SP1 and DP1, and the source and drain regions SP2 and DP2 of the respective active layers ACT1 and ACT2 through the heat treatment process, the source and drain regions SP1 and DP1, and the source and drain regions SP2 and DP2 of the respective active layers ACT1 and ACT2 may be made conductive (e.g., n+).

Meanwhile, when hydrogen is supplied to the source and drain regions SP1 and DP1, and the source and drain regions SP2 and DP2 of the respective active layers ACT1 and ACT2 through the heat treatment process after depositing the interlayer insulating layer 140, the light blocking layer BML may also be supplied with hydrogen together. In this case, the top and side surfaces of the light blocking layer BML (top and side surfaces of the light blocking layer BML exposed by the first buffer layer BF1), which are in contact with the interlayer insulating layer 140, may be relatively easily supplied with hydrogen because of direct contact with the interlayer insulating layer 140. However, it may not be easy for the interlayer insulating layer 140 to supply hydrogen to the central portion of the upper surface of the light blocking layer BML, which is not in contact with the interlayer insulating layer 140.

However, in the display device 10 according to some embodiments, because the central portion of the upper surface of the light blocking layer BML, which is not in contact with the interlayer insulating layer 140, is in contact with the first buffer layer BF1, and the first buffer layer BF1 has the hydrogen concentration higher than the hydrogen concentration of the second buffer layer BF2, it may be easy to supply hydrogen to the central portion of the upper surface of the light blocking layer BML not in contact with the interlayer insulating layer 140. Accordingly, not only the top and side surfaces (top and side surfaces of the light blocking layer BML exposed by the first buffer layer BF1) of the light blocking layer BML in contact with the interlayer insulating layer 140, but also the central portion of the upper surface of the light blocking layer BML, which is not in contact with the interlayer insulating layer 140, can be relatively easily made conductive (e.g., n+).

The first source electrode S1, the first drain electrode D1, the second source electrode S2, and the second drain electrode D2 may be formed on the interlayer insulating layer 140. The first source electrode S1, the first drain electrode D1, the second source electrode S2, and the second drain electrode D2 may be formed as a single layer or multiple layers made of any one or an alloy of molybdenum (Mo), aluminum (Al), and chromium (Cr), gold (Au), titanium (Ti), nickel (Ni), neodymium (Nd) and copper (Cu).

A first contact hole CT1 may be a hole that penetrates the interlayer insulating layer 140 to expose the light blocking layer BML. The first source electrode S1 may be connected to the light blocking layer BML through the first contact hole CT1.

A second contact hole CT2 may be a hole that penetrates the interlayer insulating layer 140 to expose the first source region SP1 of the first active layer ACT1. The first source electrode S1 may be connected to the first source region SP1 through the second contact hole CT2.

A third contact hole CT3 may be a hole that penetrates the interlayer insulating layer 140 to expose the first drain region DP1 of the first active layer ACT1. The first drain electrode D1 may be connected to the first drain region DP1 through the third contact hole CT3.

A fourth contact hole CT4 may be a hole that penetrates the interlayer insulating layer 140 to expose the second source region SP2 of the second active layer ACT2. The second source electrode S2 may be connected to the second source region SP2 through the fourth contact hole CT4.

A fifth contact hole CT5 may be a hole that penetrates the interlayer insulating layer 140 to expose the second drain region DP2 of the second active layer ACT2. The second drain electrode D2 may be connected to the second drain region DP2 through the fifth contact hole CT5.

In some embodiments, instead of the first source electrode S1, the first gate electrode G1 may be connected to the light blocking layer BML.

A passivation layer 150 may be formed on the first source and drain electrodes S1 and D1, and the second source and drain electrodes S2 and D2. The passivation layer 150 may be formed of an inorganic layer such as silicon oxide, silicon nitride, silicon oxynitride, titanium oxide, or aluminum oxide.

A planarization layer 160 may be formed on the passivation layer 150 to planarize a height difference due to the first transistor T1 and the second transistor T2. The planarization layer 160 may be formed of an organic layer such as acryl resin, epoxy resin, phenolic resin, polyamide resin, polyimide resin and the like.

FIG. 4 illustrates the first transistor T1 and the second transistor T2 formed by a top gate method, but embodiments according to the present disclosure are not limited thereto. That is, the first transistor T1 and the second transistor T2 may be formed by a bottom gate method in which the gate electrode is positioned under the active layer or by a double gate method in which the gate electrode is positioned both above and under the active layer.

A first electrode 171 of the light emitting element EML and a pixel defining layer 180 are formed on the planarization layer 160.

A sixth contact hole CT6 may be formed such that it penetrates the planarization layer 160 to expose the first source electrode S1. The first electrode 171 may be connected to the first source electrode S1 through the sixth contact hole CT6. The first electrode 171 may be formed of a metal material having high reflectivity in the top emission structure in which light is emitted in a direction to a second electrode 173 from a light emitting layer 172. For example, the first electrode 171 may be formed of a metal material such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu). Alternatively, the first electrode 171 may be formed as a single layer of molybdenum (Mo), titanium (Ti), copper (Cu), or aluminum (Al).

The pixel defining layer 180 may be formed to partition the first electrode 171 on the planarization layer 160 to define an emission area EA of each of the sub-pixels PX. To this end, the pixel defining layer 180 may be formed to cover the edge of the first electrode 171. The emission area EA of each of the sub-pixels PX represents a region in which the first electrode 171, the light emitting layer 172, and the second electrode 173 are sequentially stacked and holes from the first electrode 171 and electrons from the second electrode 173 are coupled to each other in the light emitting layer 172 to emit light. The pixel defining layer 180 may be formed of an organic layer such as acryl resin, epoxy resin, phenolic resin, polyamide resin, polyimide resin and the like.

The light emitting layer 172 may be located on the first electrode 171 and the pixel defining layer 180. The light emitting layer 172 may include an organic material to emit light in a color (e.g., a set or predetermined color). For example, the light emitting layer 172 may include a hole transporting layer, an organic material layer, and an electron transporting layer.

The second electrode 173 is formed on the light emitting layer 172. The second electrode 173 may be formed to cover the light emitting layer 172. The second electrode 173 may be a common layer commonly formed in the sub-pixels PX. A capping layer may be formed on the second electrode 173.

In the top emission structure, the second electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the second electrode 173 is formed of a semi-transmissive metal material, the light emission efficiency can be increased due to a micro-cavity effect.

An encapsulation layer 190 may be formed on the second electrode 173. The encapsulation layer 190 may include at least one inorganic layer to prevent or reduce instances of oxygen, moisture, or other contaminants permeating into the light emitting layer 172 and the second electrode 173. In addition, the encapsulation layer 190 may include at least one organic layer to protect the light emitting layer 172 from foreign substances such as dust.

Alternatively, instead of the encapsulation layer 190, a substrate may be located on the second electrode 173, and a space between the second electrode 173 and the substrate may be empty in a vacuum state, or a filling film may be formed therein. The filling film may be an epoxy filling film or a silicone filling film.

According to some embodiments, in the case of the switching transistor, it may be desirable to minimize or reduce a parasitic capacitance in the display panel 100 in order to ensure a fast charging rate. On the other hand, in the case of the driving transistor, it may be desirable to increase a driving range. Therefore, the light blocking layer BML may be designed to overlap the first transistor T1 without overlapping the second transistor T2.

Further, by simultaneously (or concurrently) forming the light blocking layer BML and the second active layer ACT2 using one mask, it may be possible to omit a separate mask for forming the light blocking layer BML.

Further, when hydrogen is supplied to the source and drain regions SP1 and DP1 and the source and drain regions SP2 and DP2 of the respective active layers ACT1 and ACT2 through the heat treatment process after depositing the interlayer insulating layer 140, the light blocking layer BML is also supplied with hydrogen together. In this case, the top and side surfaces of the light blocking layer BML (top and side surfaces of the light blocking layer BML exposed by the first buffer layer BF1), which are in contact with the interlayer insulating layer 140, may be relatively easily supplied with hydrogen because of direct contact with the interlayer insulating layer 140. However, it may not be easy for the interlayer insulating layer 140 to supply hydrogen to the central portion of the upper surface of the light blocking layer BML, which is not in contact with the interlayer insulating layer 140.

However, in the display device 10 according to some embodiments, because the central portion of the upper surface of the light blocking layer BML, which is not in contact with the interlayer insulating layer 140, is in contact with the first buffer layer BF1, and the first buffer layer BF1 has the hydrogen concentration higher than the hydrogen concentration of the second buffer layer BF2, it may be easy to supply hydrogen to the central portion of the upper surface of the light blocking layer BML not in contact with the interlayer insulating layer 140. Accordingly, not only the top and side surfaces (top and side surfaces of the light blocking layer BML exposed by the first buffer layer BF1) of the light blocking layer BML in contact with the interlayer insulating layer 140, but also the central portion of the upper surface of the light blocking layer BML, which is not in contact with the interlayer insulating layer 140, can be relatively easily made conductive (e.g., n+).

Hereinafter, a method for manufacturing a display device according to some embodiments will be described. In the following description, the same components as those of the above-described embodiments are denoted by the same reference numerals, and a description thereof will be omitted or simplified.

Figure 7:
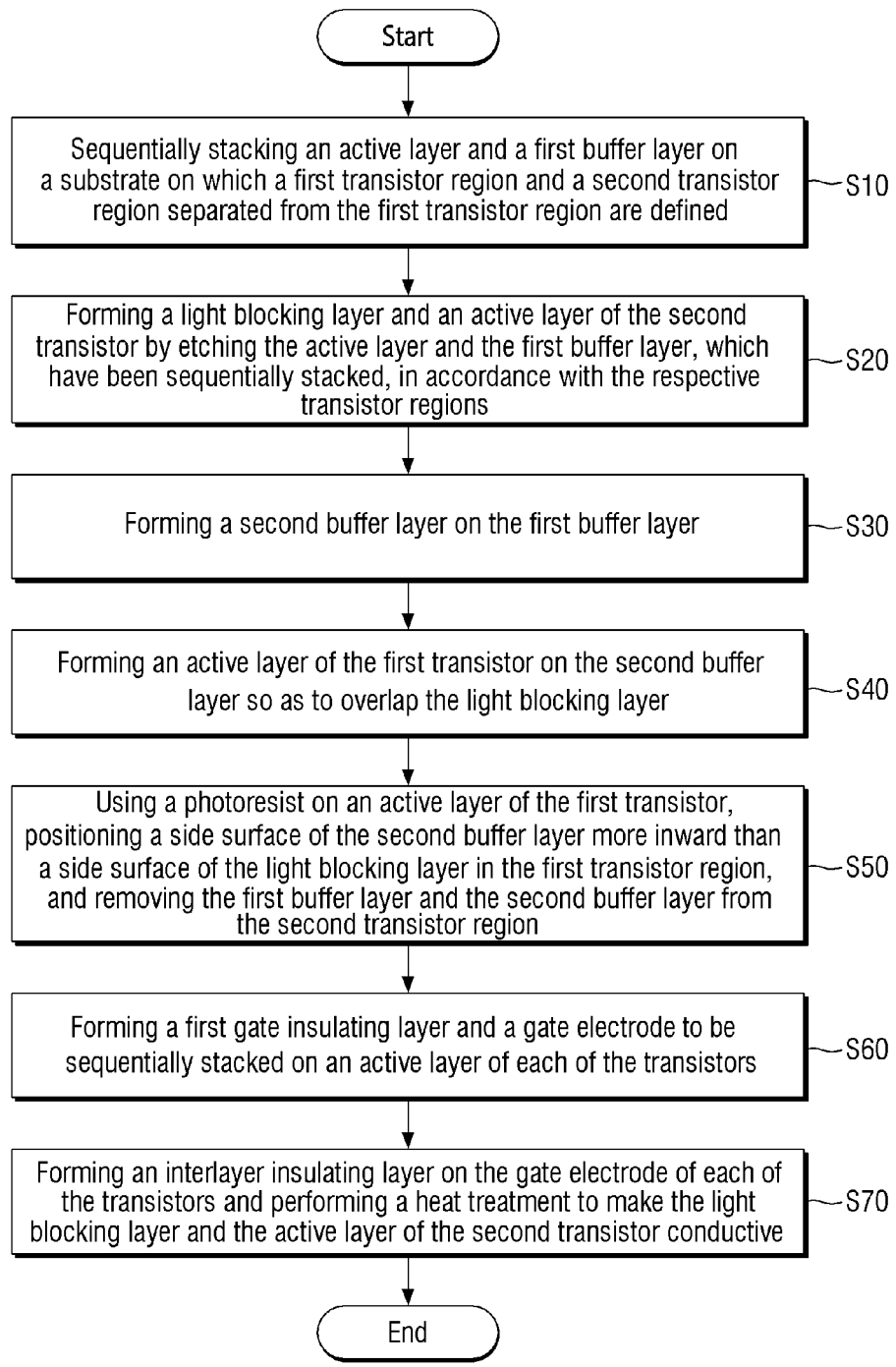
FIG. 7 is a flowchart of a method for manufacturing a display device according to some embodiments.

FIG. 7 is a flowchart of a method for manufacturing a display device according to some embodiments. FIGS. 8 to 16 are cross-sectional views showing the steps of a method for manufacturing a display device according to some embodiments.

Figure 8:
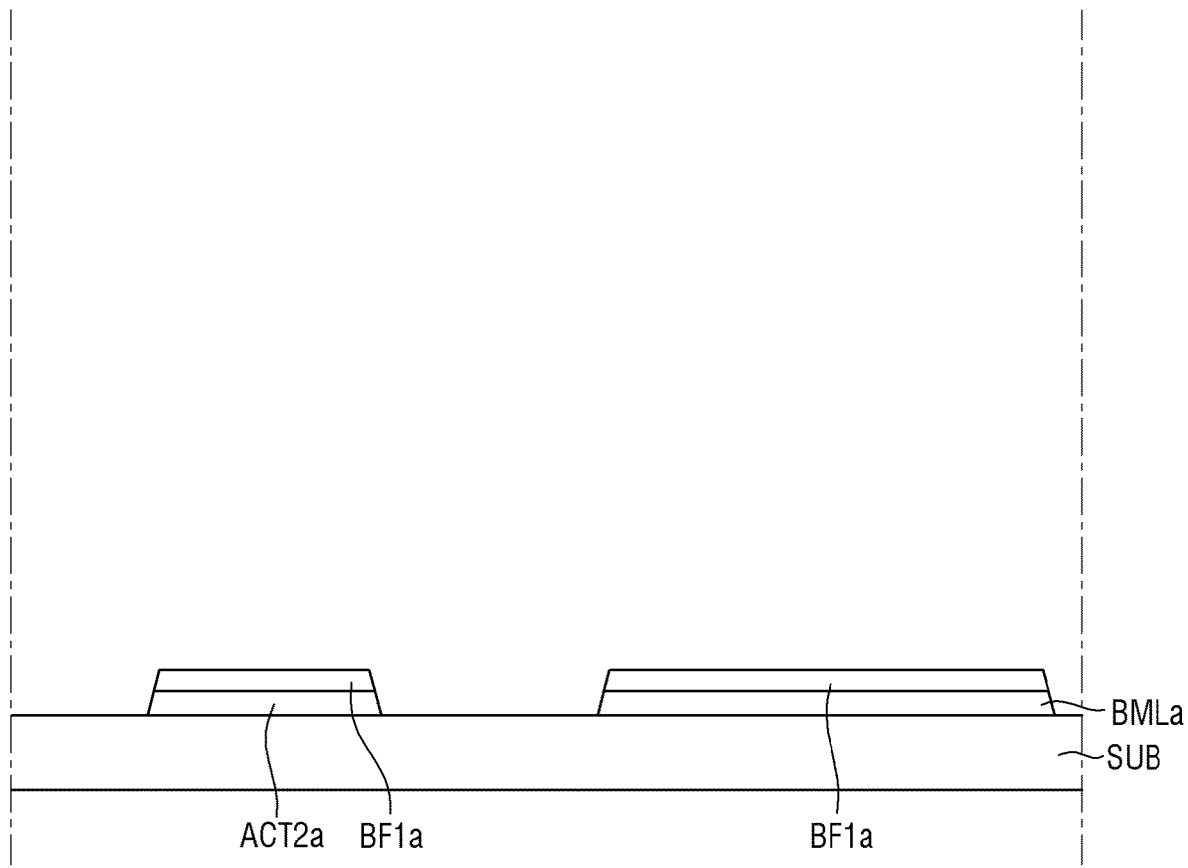
FIGS. 8 to 16 are cross-sectional views showing the steps of a method for manufacturing a display device according to some embodiments.

Referring to FIGS. 7 and 8, an active layer and a first buffer layer are sequentially stacked on the substrate SUB (step S10) in which a first transistor region and a second transistor region separated from the first transistor region are defined.

The substrate SUB may be a rigid substrate or a flexible substrate which can be bent, folded or rolled. The substrate SUB may be formed of an insulating material such as glass, quartz, or a polymer resin.

The first transistor region may be a region where the first transistor T1 described above with reference to FIG. 4 will be located, and the second transistor region may be a region where the second transistor T2 described above with reference to FIG. 4 will be located.

The active layer may be formed directly on the substrate SUB.

The active layer may be made of an oxide semiconductor including indium (In), gallium (Ga), and oxygen (O). For example, the active layer may be formed of IGZO (indium (In), gallium (Ga), zinc (Zn) and oxygen (O)), IGZTO (indium (In), gallium (Ga), zinc (Zn), tin (Sn), and oxygen (O)), or IGTO (indium (In), gallium (Ga), tin (Sn), and oxygen (O)).

The first buffer layer is formed on the active layer formed on the substrate SUB. The first buffer layer may be formed directly on the active layer.

The first buffer layer may include silicon nitride or silicon oxynitride.

The first buffer layer may have the hydrogen concentration higher than the hydrogen concentration of the second buffer layer, which will be described later.

Then, a light blocking layer BMLa, and a second active layer ACT2a of the second transistor are formed by etching the active layer and the first buffer layer, which have been sequentially stacked, in accordance with the respective transistor regions (step S20).

For example, after forming the first buffer layer, the second active layer ACT2a, a first buffer layer BF1a stacked on the second active layer ACT2a, the light blocking layer BMLa, and a first buffer layer BF1a stacked on the light blocking layer BMLa are formed through etching as illustrated in FIG. 8. The stacked second active layer ACT2a and first buffer layer BF1a, and the stacked light blocking layer BMLa and first buffer layer BF1a may be arranged to be separated from each other. The side surfaces of the stacked second active layer ACT2a and first buffer layer BF1a may be aligned in the thickness direction. Also, the side surfaces of the stacked light blocking layer BMLa and first buffer layer BF1a may be aligned in the thickness direction.

The etching may include dry etching.

In some embodiments, the etching may include wet etching.

In some other embodiments, the etching may include successive steps of dry etching and wet etching.

The stacked second active layer ACT2a and first buffer layer BF1a may be located in the second transistor region, and the stacked light blocking layer BMLa and first buffer layer BF1a may be located in the first transistor region.

According to the method for manufacturing a display device according to some embodiments, because the light blocking layer BMLa and the second active layer ACT2a are simultaneously (or concurrently) formed by etching the same layer using the same mask, it may be possible to omit a separate mask for forming the light blocking layer BMLa.

Figure 9:
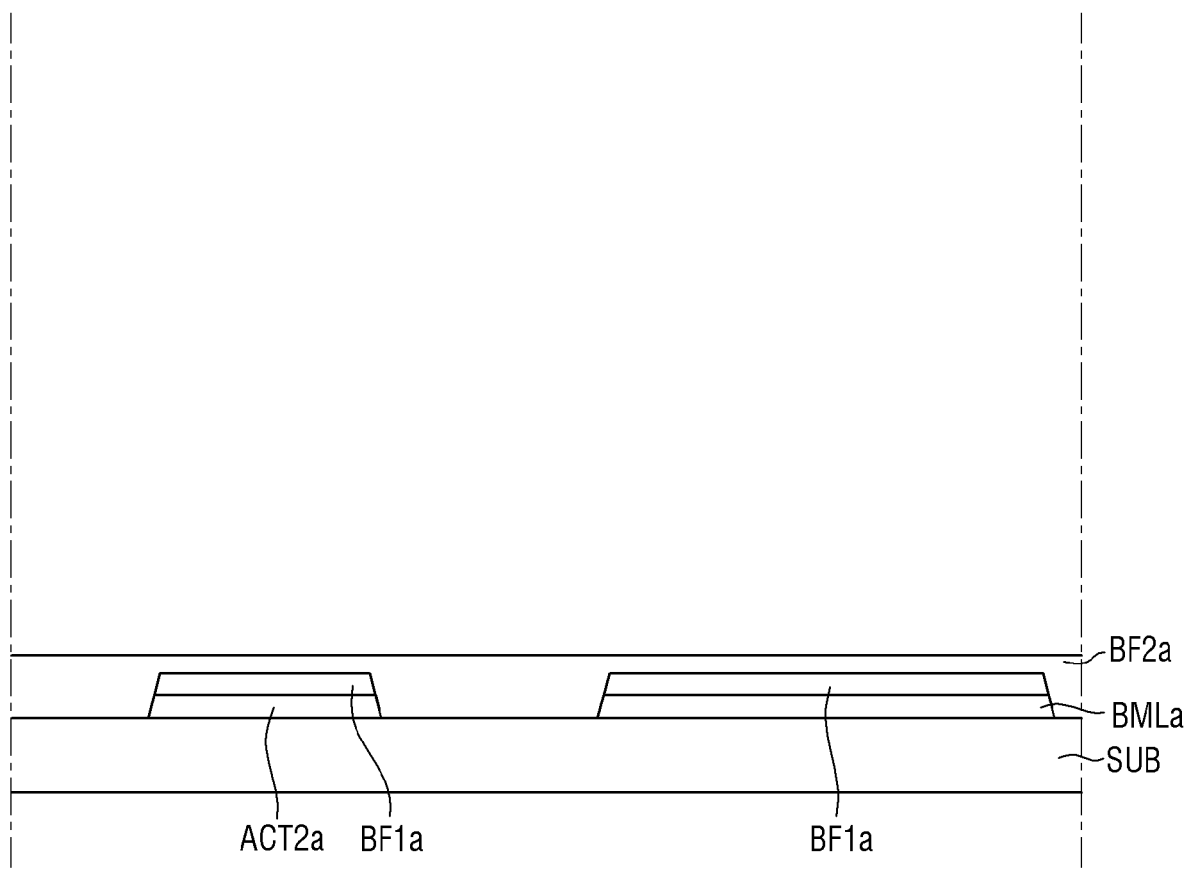

Subsequently, referring to FIGS. 7 and 9, a second buffer layer BF2a is formed on the stacked second active layer ACT2a and first buffer layer BF1a, and the stacked light blocking layer BMLa and first buffer layer BF1a (step S30).

The second buffer layer BF2a may be formed directly on the side surfaces of the stacked second active layer ACT2a and first buffer layer BF1a, the upper surface of the first buffer layer BF1a of the second transistor region, the side surfaces of the stacked light blocking layer BMLa and first buffer layer BF1a, and the upper surface of the first buffer layer BF1a of the first transistor region.

The second buffer layer BF2a may include silicon oxide.

As described above, the first buffer layer BF1a may have the hydrogen concentration higher than the hydrogen concentration of the second buffer layer BF2a. Because the hydrogen concentration of the first buffer layer BF1a is higher than the hydrogen concentration of the second buffer layer BF2a, the light blocking layer BML (see FIG. 4) may be made conductive (e.g., n+), similarly to the second active layer ACT2 (see FIG. 4), as will be described later.

Figure 10:
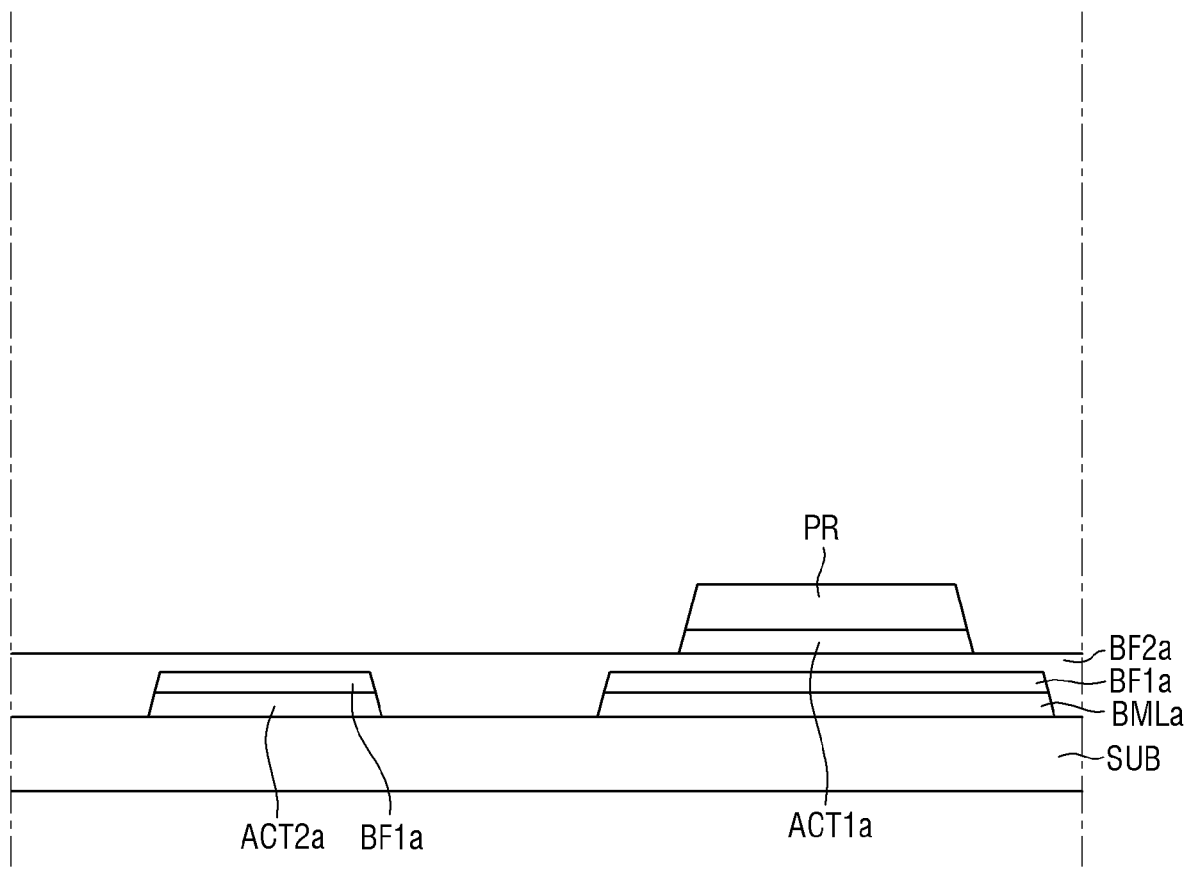

Next, referring to FIGS. 7 and 10, a first active layer ACT1a of the first transistor is formed on the second buffer layer BF2a to overlap the light blocking layer BMLa (step S40).

The first active layer ACT1a may be formed of an oxide semiconductor including indium (In), gallium (Ga), and oxygen (O). For example, the first active layer ACT1a may be made of IGZO (indium (In), gallium (Ga), zinc (Zn) and oxygen (O)), IGZTO (indium (In), gallium (Ga), zinc (Zn)), tin (Sn) and oxygen (O)), or IGTO (indium (In), gallium (Ga), tin (Sn), and oxygen (O)).

The first active layer ACT1a may be arranged to overlap the central portion of the light blocking layer BMLa and may expose the side portions of the light blocking layer BMLa without overlapping the side portions thereof.

After forming the first active layer ACT1a, a photoresist PR is formed to overlap the first active layer ACT1a. The side surface of the photoresist PR may be aligned with the side surface of the first active layer ACT1a in the thickness direction.

Figure 11:
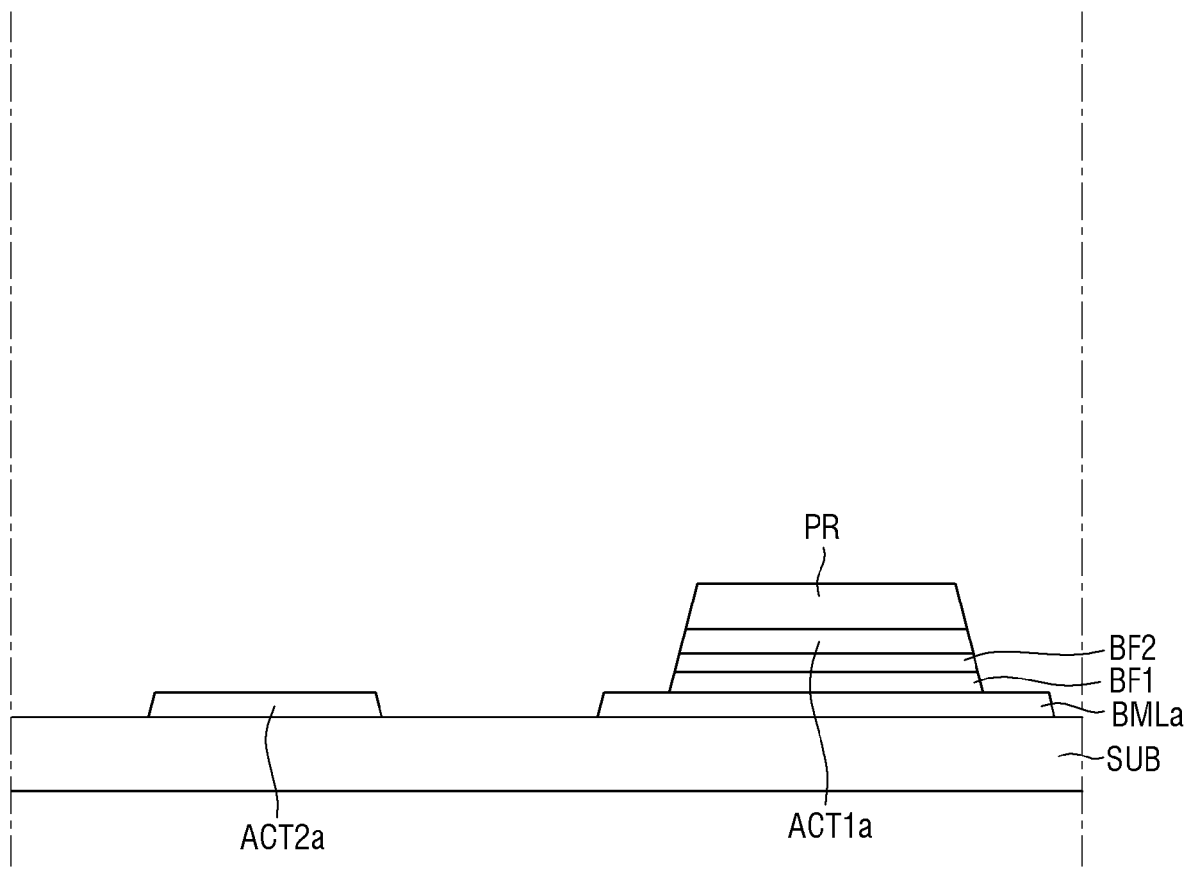

Subsequently, referring to FIGS. 7 and 11, the photoresist PR on the first active layer ACT1a of the first transistor is used to position the side surface of the second buffer layer BF2 more inward than the side surface of the light blocking layer BMLa in the first transistor region and remove the first buffer layer BF1a (see FIG. 10) and the second buffer layer BF2a (see FIG. 10) from the second transistor region (step S50).

Step S50 may be performed through dry etching. When performing step S50, $CF_4$, $C_4F_8$ or the like may be used as an etching gas.

By using the etching gas, an etching rate of the buffer layers BF1a and BF2a may be significantly greater than an etching rate of the light blocking layer BMLa and the substrate SUB. In other words, the etching gas may have etching selectivity to the buffer films BF1a and BF2a, which is significantly higher than etching selectivity to the light blocking layer BMLa and the substrate SUB. Accordingly, when step S50 is performed using the etching gas, the buffer layers BF1a and BF2a overlapping the photoresist PR, and the first and second buffer layers BF1a and BF2a in the second transistor region may be relatively easily etched, whereas the light blocking layer BMLa and the substrate SUB may not be etched or may not be substantially etched.

Through step S50, the buffer layers BF1 and BF2 illustrated in FIGS. 4 and 5 are formed.

Figure 12:
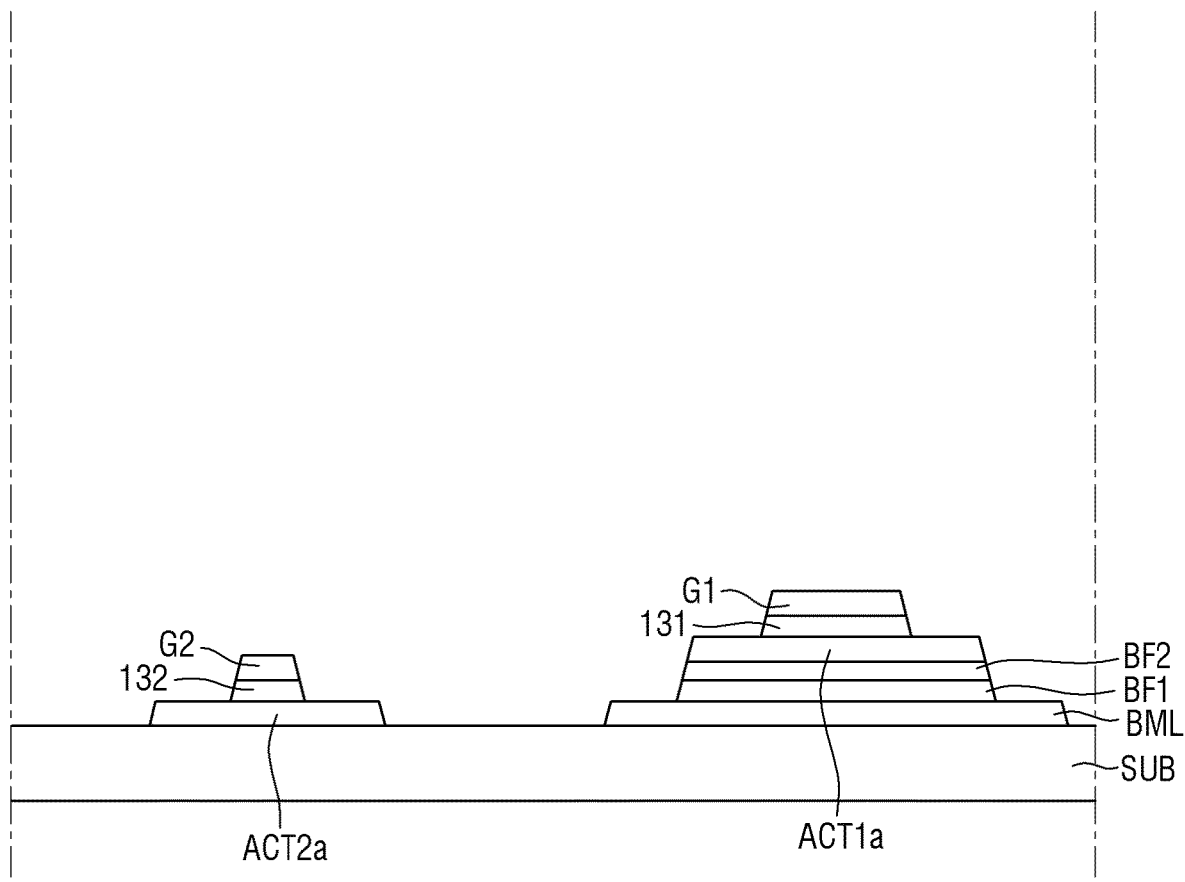
Figure 13:
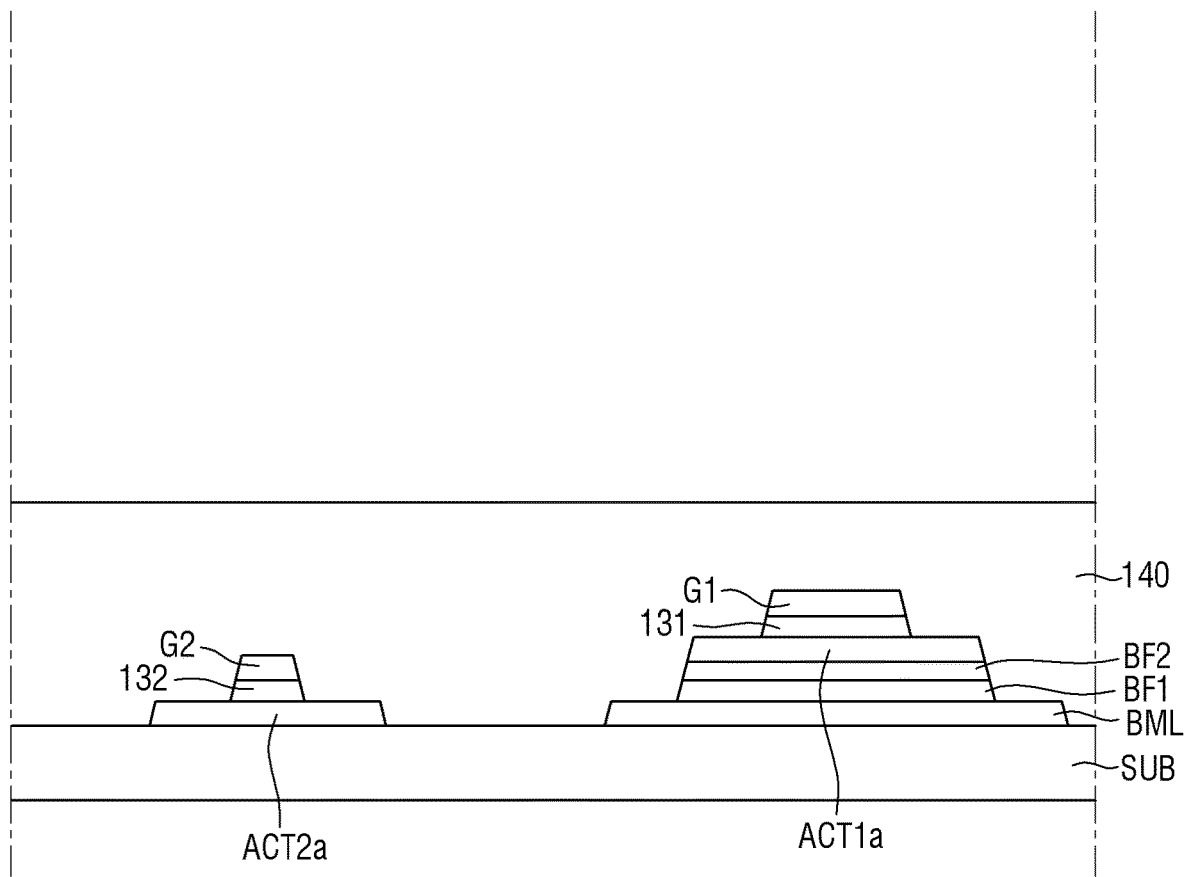
Figure 14:
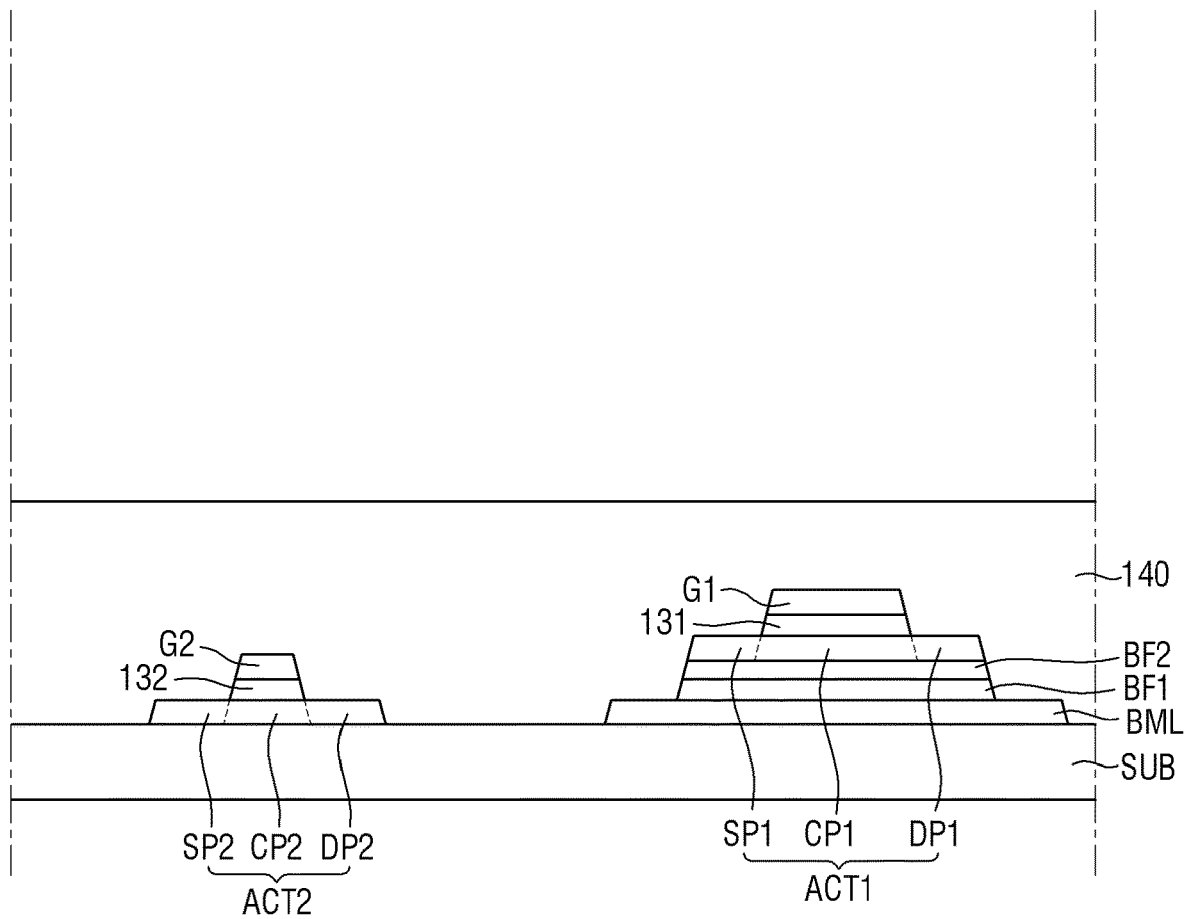

Subsequently, as shown in FIGS. 4, 7, and 12, the gate insulating layers 131 and 132 and the gate electrodes G1 and G2 are formed to be sequentially stacked on the active layers ACT1a and ACT2a of the respective transistors (step S60).

The gate insulating layers 131 and 132 may include the first gate insulating layer 131 located on a partial area of the first active layer ACT1a and the second gate insulating layer 132 located on a partial area of the second active layer ACT2a. The first and second gate insulating layers 131 and 132 may be located on the same layer, may be made of the same material and may be formed through the same step. The gate insulating layers 131 and 132 may be formed of an inorganic layer, for example, silicon oxide.

The gate insulating layers 131 and 132 may be arranged to overlap the central portions (channel regions CP1 and CP2 of active layers ACT1 and ACT2 of FIG. 4) of the active layers ACT1a and ACT2a, respectively.

The gate insulating layers 131 and 132 may have the hydrogen concentrations lower than the hydrogen concentration of the first buffer layer BF1a.

The gate electrodes G1 and G2 are formed on the gate insulating layers 131 and 132.

The gate electrodes G1 and G2 may include the first gate electrode G1 located on the first gate insulating layer 131 and the second gate electrode G2 located on the second gate insulating layer 132. The first gate electrode G1 may be arranged to overlap the central portion (first channel region CP1 of FIG. 4) of the first active layer ACT1a, and the second gate electrode G2 may be arranged to overlap the central portion (second channel region CP2 of FIG. 4) of the second active layer ACT2a. The side surfaces of the gate electrodes G1 and G2 may be respectively aligned with the side surfaces of the gate insulating layers 131 and 132 in the thickness direction.

The gate electrodes G1 and G2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

Thereafter, referring to FIGS. 4, 7, 13 and 14, the interlayer insulating layer 140 is formed on the gate electrodes G1 and G2 of the respective transistors and a heat treatment is performed to make the light blocking layer BML and the second active layer ACT2 of the second transistor conductive (step S70).

The interlayer insulating layer 140 may be formed of an inorganic layer such as silicon oxide, silicon nitride, silicon oxynitride, titanium oxide, or aluminum oxide.

The interlayer insulating layer 140 may have the hydrogen concentration higher than the hydrogen concentration of the second buffer layer BF2 according to some embodiments. In the method for manufacturing a display device, the interlayer insulating layer 140 is deposited, and then serves to supply hydrogen to the source and drain regions SP1 and DP1, and the source and drain regions SP2 and DP2 of respective active layers ACT1 and ACT2 through the heat treatment step.

The heat treatment step may be performed in a chamber maintained at about 250° C. for about 30 minutes. The temperature and time of the heat treatment step are not limited thereto.

After the interlayer insulating layer 140 is deposited, if hydrogen is supplied to the source and drain regions SP1 and DP1, and the source and drain regions SP2 and DP2 of the respective active layers ACT1 and ACT2 through the heat treatment step, the source and drain regions SP1 and DP1 and the source and drain regions SP2 and DP2 of the respective active layers ACT1 and ACT2 may be made conductive (e.g., n+).

Meanwhile, when hydrogen is supplied to the source and drain regions SP1 and DP1, and the source and drain regions SP2 and DP2 of the respective active layers ACT1 and ACT2 through the heat treatment step after depositing the interlayer insulating layer 140, the light blocking layer BML may also be supplied with hydrogen together. In this case, the top and side surfaces of the light blocking layer BML (top and side surfaces of the light blocking layer BML exposed by the first buffer layer BF1), which are in contact with the interlayer insulating layer 140, may be relatively easily supplied with hydrogen because of direct contact with the interlayer insulating layer 140. However, it may not be easy for the interlayer insulating layer 140 to supply hydrogen to the central portion of the upper surface of the light blocking layer BML, which is not in contact with the interlayer insulating layer 140.

However, according to the method for manufacturing a display device according to some embodiments, because the central portion of the upper surface of the light blocking layer BML, which is not in contact with the interlayer insulating layer 140, is in contact with the first buffer layer BF1, and the first buffer layer BF1 has the hydrogen concentration higher than the hydrogen concentration of the second buffer layer BF2, it may be easy to supply hydrogen to the central portion of the upper surface of the light blocking layer BML not in contact with the interlayer insulating layer 140. Accordingly, not only the top and side surfaces (top and side surfaces of the light blocking layer BML exposed by the first buffer layer BF1) of the light blocking layer BML in contact with the interlayer insulating layer 140, but also the central portion of the upper surface of the light blocking layer BML, which is not in contact with the interlayer insulating layer 140, can be relatively easily made conductive (e.g., n+).

Figure 15:
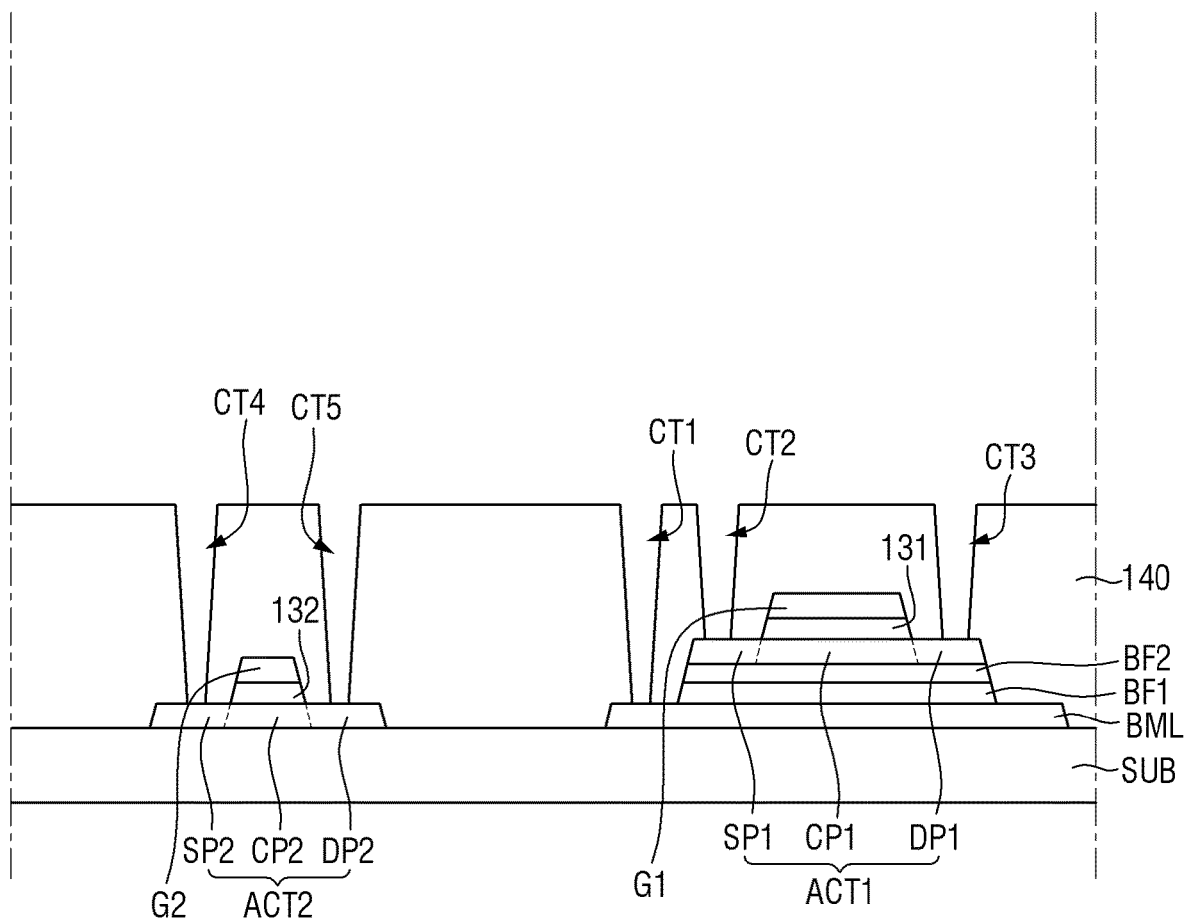
Figure 16:
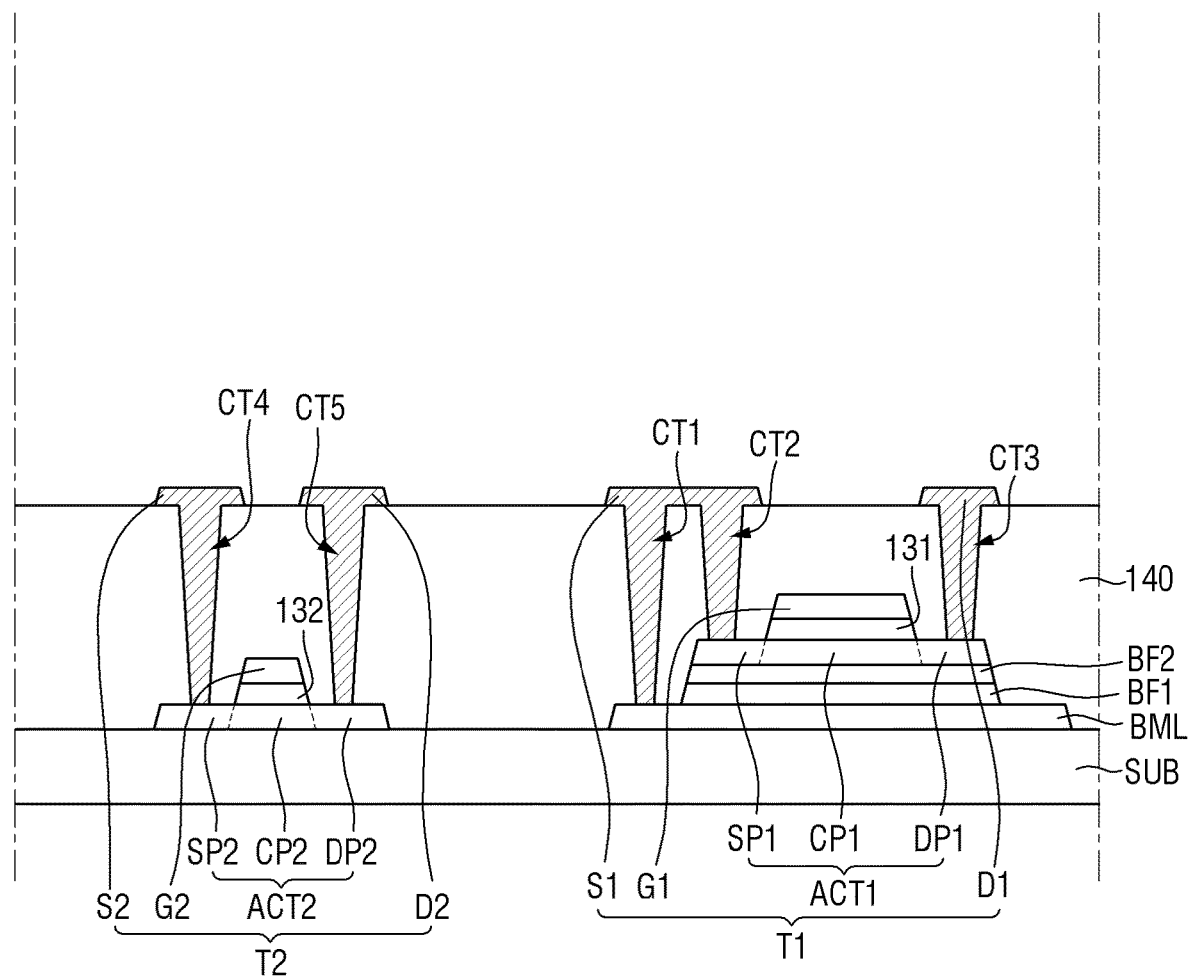

Thereafter, referring to FIGS. 4, 7, 15 and 16, the contact holes CT1 to CT5 described above with reference to FIG. 4 are formed, and the source and drain electrodes S1, S2, D1, and D2 are formed. Because the subsequent steps have been described above with reference to FIG. 4, a redundant description will be omitted below.

Hereinafter, other embodiments will be described. In the following embodiments, the same components as those of the above-described embodiments are denoted by the same reference numerals, and a description thereof will be omitted or simplified.

Figure 17:
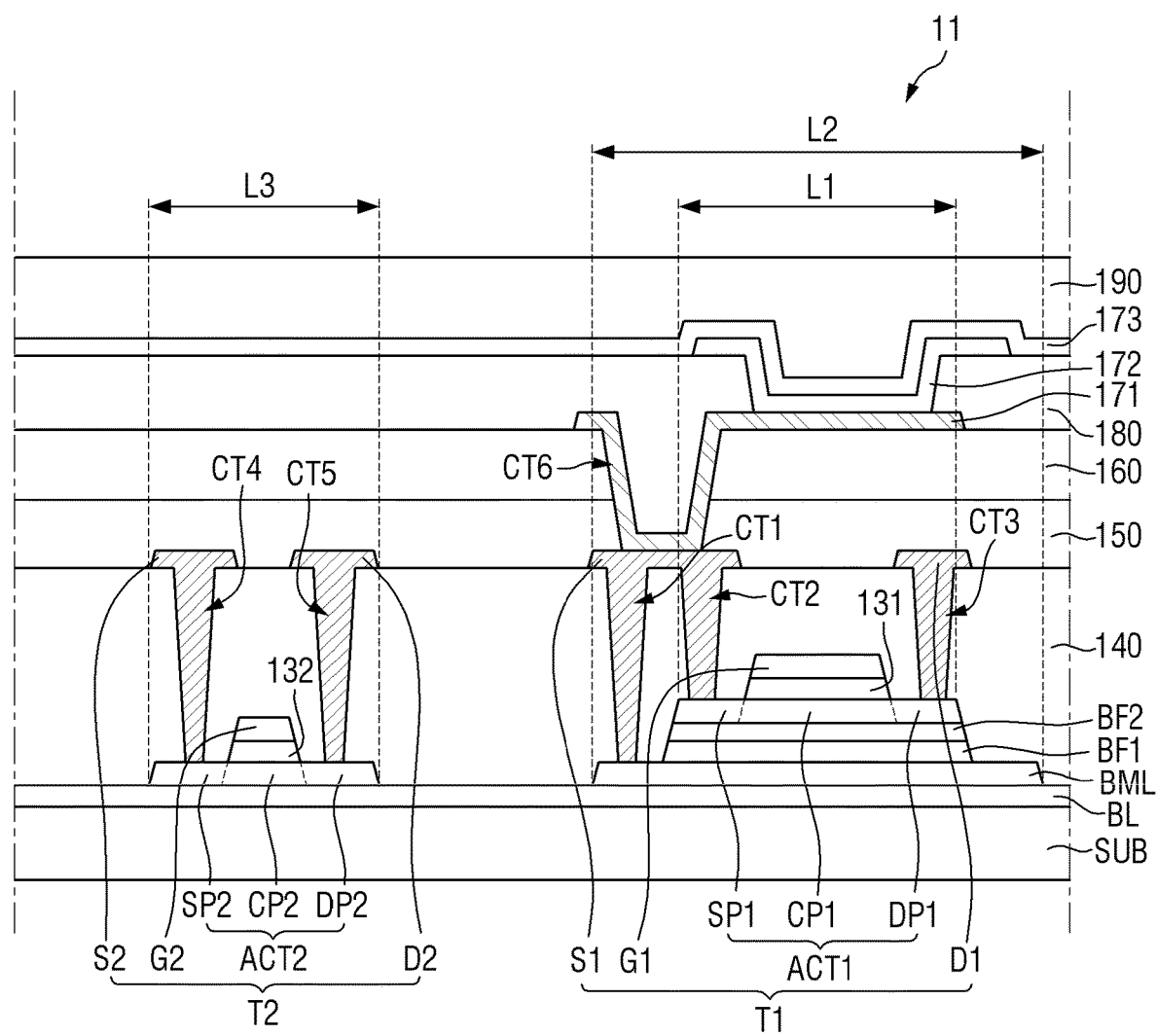
FIG. 17 is a cross-sectional view illustrating a first transistor and a second transistor according to some embodiments.

FIG. 17 is a cross-sectional view illustrating a first transistor and a second transistor according to some embodiments.

Referring to FIG. 17, a display device 11 according to the present embodiment is different from the display device 10 according to an embodiment in that the display device 11 further includes a barrier layer BL located between the substrate SUB and the light blocking layer BML, and between the substrate SUB and the second active layer ACT2 of the second transistor T2.

For example, the display device 11 according to some embodiments may further include the barrier layer BL located between the substrate SUB and the light blocking layer BML, and between the substrate SUB and the second active layer ACT2 of the second transistor T2.

The barrier layer BL may be in direct contact with the substrate SUB, the light blocking layer BML, and the second active layer ACT2. The barrier layer BL may include silicon oxide. In some embodiments, the barrier layer BL may include silicon oxynitride.

The barrier layer BL may have a hydrogen concentration lower than the hydrogen concentration of the first buffer layer BF1. According to the display device 11 according to some embodiments, because the hydrogen concentration of the barrier layer BL is lower than the hydrogen concentration of the first buffer layer BF1, it may be possible to minimize the amount of hydrogen entering the second active layer ACT2.

Accordingly, a large amount of hydrogen may be prevented from entering the second active layer ACT2, thereby preventing or reducing instances of a short circuit (short circuit between the second source region SP2 and the second drain region DP2) of the second active layer ACT2.

According to some embodiments, because the central portion of the upper surface of the light blocking layer BML, which is not in contact with the interlayer insulating layer 140, is in contact with the first buffer layer BF1, and the first buffer layer BF1 has the hydrogen concentration higher than the hydrogen concentration of the second buffer layer BF2, it may be easy to supply hydrogen to the central portion of the upper surface of the light blocking layer BML not in contact with the interlayer insulating layer 140. Accordingly, not only the top and side surfaces (top and side surfaces of the light blocking layer BML exposed by the first buffer layer BF1) of the light blocking layer BML in contact with the interlayer insulating layer 140, but also the central portion of the upper surface of the light blocking layer BML, which is not in contact with the interlayer insulating layer 140, can be relatively easily made conductive (e.g., n+).

Although embodiments of the invention have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A display device comprising:
a substrate;
a light blocking layer of a driving transistor and an active layer of a switching transistor on the substrate;
a buffer layer on the light blocking layer, the buffer layer overlapping the light blocking layer;
an active layer of the driving transistor on the buffer layer, wherein the light blocking layer and the active layer of the driving transistor are electrically connected through an electrode of the driving transistor;
a first gate insulating layer on the active layer of the driving transistor and the active layer of the switching transistor; and
a first gate electrode on the first gate insulating layer and overlapping the active layer of the driving transistor and a second gate electrode overlapping the active layer of the switching transistor,
wherein the light blocking layer and the active layer of the switching transistor are on a same layer.

2. The display device of claim 1, wherein the light blocking layer and the active layer of the switching transistor include a same material.

3. The display device of claim 1, wherein side surfaces of the buffer layer are located more inward than side surfaces of the light blocking layer, respectively.

4. The display device of claim 3, wherein a side surface of the active layer of the driving transistor is aligned with a side surface of the buffer layer in a thickness direction.

5. The display device of claim 4, wherein a side surface of the first gate insulating layer overlapping the active layer of the driving transistor is aligned with a side surface of the first gate electrode in a thickness direction.

6. The display device of claim 1, wherein each of the active layers of the driving transistor and the switching transistor is formed of an oxide semiconductor containing at least one metal of indium, gallium, zinc, or tin.

7. The display device of claim 1, wherein a length of the active layer of the driving transistor is greater than a length of the active layer of the switching transistor.

8. The display device of claim 7, wherein a length of the light blocking layer is greater than a length of the active layer of the driving transistor.

9. A display device comprising:
a substrate;
a light blocking layer of a driving transistor and an active layer of a switching transistor on the substrate;
a buffer layer on the light blocking layer, the buffer layer overlapping the light blocking layer;
an active layer of the driving transistor on the buffer layer;
a first gate insulating layer on the active layer of the driving transistor and the active layer of the switching transistor; and
a first gate electrode on the first gate insulating layer and overlapping the active layer of the driving transistor and a second gate electrode overlapping the active layer of the switching transistor,
wherein the light blocking layer and the active layer of the switching transistor are on a same layer,
wherein the buffer layer includes a first buffer layer on the light blocking layer, and a second buffer layer on the first buffer layer, and
the first buffer layer has a hydrogen concentration higher than that of the second buffer layer.

10. The display device of claim 9, wherein the second buffer layer includes silicon oxide, and the first buffer layer includes silicon nitride or silicon oxynitride.

11. The display device of claim 10, further comprising a barrier layer between the substrate and the light blocking layer, and between the substrate and the active layer of the switching transistor.

12. The display device of claim 11, wherein the barrier layer has a hydrogen concentration lower than that of the first buffer layer.

13. The display device of claim 12, wherein the barrier layer includes silicon oxide.

14. The display device of claim 9, wherein the first gate insulating layer has a hydrogen concentration lower than that of the first buffer layer.

15. The display device of claim 9, further comprising an interlayer insulating layer on the first gate electrode and the second gate electrode,
wherein the interlayer insulating layer has a hydrogen concentration higher than that of the second buffer layer.

16. The display device of claim 15, further comprising: as electrodes on the interlayer insulating layer,
a first source electrode connected to a first source region of the active layer of the driving transistor;
a first drain electrode connected to a first drain region of the active layer of the driving transistor;
a second source electrode connected to a second source region of the active layer of the switching transistor; and
a second drain electrode connected to a second drain region of the active layer of the switching transistor.

17. The display device of claim 16, wherein the first source electrode is connected to the light blocking layer.

18. A method for manufacturing a display device, the method comprising:
sequentially stacking an active layer and a first buffer layer on a substrate on which a first transistor region and a second transistor region separated from the first transistor region are defined;
forming a light blocking layer and an active layer of the second transistor region by etching the active layer and the first buffer layer, which have been sequentially stacked, in accordance with the respective transistor regions; and forming a second buffer layer on the first buffer layer, wherein the first buffer layer has a hydrogen concentration higher than that of the second buffer layer.

19. The method of claim 18, further comprising, after forming the second buffer layer, forming an active layer of the first transistor region on the second buffer layer so as to overlap the light blocking layer.

20. The method of claim 18, further comprising:

using a photoresist on an active layer of the first transistor region, positioning a side surface of the second buffer layer more inward than a side surface of the light blocking layer in the first transistor region, and removing the first buffer layer and the second buffer layer from the second transistor region.

21. The method of claim 20, further comprising forming a first gate insulating layer and a gate electrode to be sequentially stacked on an active layer of each of the transistor regions.

22. The method of claim 21, further comprising forming an interlayer insulating layer on the gate electrode of each of the transistor regions and performing a heat treatment to make the light blocking layer and the active layer of the second transistor region conductive.

\* \* \* \* \*